(12) United States Patent
Su et al.

(10) Patent No.: US 12,238,969 B2
(45) Date of Patent: Feb. 25, 2025

(54) DISPLAY SUBSTRATE, METHOD FOR MANUFACTURING THE SAME, AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Tongshang Su, Beijing (CN); Bin Zhou, Beijing (CN); Jun Cheng, Beijing (CN); Qinghe Wang, Beijing (CN); Yongchao Huang, Beijing (CN); Dacheng Zhang, Beijing (CN); Liangchen Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 523 days.

(21) Appl. No.: 17/615,835

(22) PCT Filed: Feb. 26, 2021

(86) PCT No.: PCT/CN2021/078126
§ 371 (c)(1),
(2) Date: Dec. 2, 2021

(87) PCT Pub. No.: WO2022/178827
PCT Pub. Date: Sep. 1, 2022

(65) Prior Publication Data
US 2023/0200128 A1 Jun. 22, 2023

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1201* (2023.02); *H10K 59/122* (2023.02); *H10K 59/353* (2023.02); *H10K 71/00* (2023.02)

(58) Field of Classification Search
CPC ............ H10K 59/1213; H10K 59/353; H10K 59/1201; H10K 59/122; H10K 71/00
(Continued)

(56) References Cited

U.S. PATENT DOCUMENTS 9,954,039 B2    4/2018  Im et al.
2015/0179718 A1  6/2015  Kim et al.
(Continued)

FOREIGN PATENT DOCUMENTS

| CN | 102544053 A | 7/2012 |
|---|---|---|
| CN | 104733495 A | 6/2015 |

(Continued)

*Primary Examiner* — Dzung Tran
(74) *Attorney, Agent, or Firm* — Ling Wu; Stephen Wu; Ling and Yang Intellectual Property

(57) ABSTRACT

The present disclosure provides a display substrate, a method for manufacturing the same, and a display device. The display substrate includes a drive circuit layer disposed on a base substrate and a light emitting structure layer disposed on a side of the drive circuit layer away from the base substrate. The light emitting structure layer includes an anode, an organic light emitting layer, a cathode, and an auxiliary electrode. The organic light emitting layer is respectively connected to the anode and the cathode, and the cathode is connected to the auxiliary electrode; in a plane parallel to the display substrate, an edge of the auxiliary electrode is provided with a structure depressed towards a center of the auxiliary electrode.

20 Claims, 7 Drawing Sheets

(51) Int. Cl.
*H10K 59/122* (2023.01)
*H10K 59/35* (2023.01)
*H10K 71/00* (2023.01)

(58) Field of Classification Search
USPC .......................................................... 257/40
See application file for complete search history.

(56) References Cited

U.S. PATENT DOCUMENTS

| | | | |
|---|---|---|---|
| 2015/0179719 A1* | 6/2015 | Nam | H10K 50/814 |
| | | | 438/4 |
| 2016/0013436 A1* | 1/2016 | Im | H10K 50/805 |
| | | | 257/40 |
| 2016/0013438 A1 | 1/2016 | Im et al. | |
| 2016/0035813 A1* | 2/2016 | Lee | H10K 59/122 |
| | | | 438/23 |
| 2016/0149155 A1 | 5/2016 | Kim | |
| 2016/0240598 A1* | 8/2016 | You | H10K 59/131 |
| 2016/0351636 A1 | 12/2016 | Lee et al. | |
| 2017/0170246 A1 | 6/2017 | Im et al. | |
| 2018/0158878 A1 | 6/2018 | Lee et al. | |
| 2018/0190934 A1* | 7/2018 | Choi | H10K 50/824 |
| 2018/0212007 A1* | 7/2018 | Lee | H10K 59/131 |
| 2019/0097161 A1* | 3/2019 | Im | H10K 50/824 |
| 2019/0097168 A1 | 3/2019 | Pang | |
| 2020/0212162 A1 | 7/2020 | Fan | |
| 2020/0343315 A1* | 10/2020 | Lin | H10K 59/8792 |
| 2022/0037616 A1 | 2/2022 | Liu et al. | |

FOREIGN PATENT DOCUMENTS

| | | |
|---|---|---|
| CN | 105261632 A | 1/2016 |
| CN | 106206645 A | 12/2016 |
| CN | 106206646 A | 12/2016 |
| CN | 106887528 A | 6/2017 |
| CN | 108172597 A | 6/2018 |
| CN | 109244269 A | 1/2019 |
| CN | 109560210 A | 4/2019 |
| CN | 109599502 A | 4/2019 |
| CN | 111864116 A | 10/2020 |
| EP | 3107130 A3 | 4/2017 |
| JP | 2008135325 A | 6/2008 |
| KR | 20170078969 A | 7/2017 |

* cited by examiner

DISPLAY SUBSTRATE, METHOD FOR MANUFACTURING THE SAME, AND DISPLAY DEVICE

CROSS-REFERENCE TO RELATED APPLICATION

The present disclosure is a U.S. National Phase Entry of International Application PCT/CN2021/078126 having an international filing date of Feb. 26, 2021, and the contents disclosed in the above-mentioned application are hereby incorporated as a part of this application.

TECHNICAL FIELD

The present disclosure relates to, but is not limited to, the technical field of display, in particular to a display substrate, a method for manufacturing the same, and a display device.

BACKGROUND

An Organic Light Emitting Diode (OLED) is an active light emitting display device, which has advantages such as self-luminescence, wide angle of view, high contrast, low power consumption, high response speed, lightness and thinness, flexibility, and low cost. With the continuous development of the display technologies, flexible display devices with OLEDs as light emitting devices and signals controlled by Thin Film Transistors (TFTs) have become the mainstream products in the field of display.

SUMMARY

The following is a summary of the subject matter detailed herein. This summary is not intended to limit the scope of protection of the claims.

The present disclosure provides a display substrate, including a drive circuit layer disposed on a base substrate and a light emitting structure layer disposed on a side of the drive circuit layer away from the base substrate, wherein the light emitting structure layer includes an anode, an organic light emitting layer, a cathode, and an auxiliary electrode, the organic light emitting layer is respectively connected to the anode and the cathode, and the cathode is connected to the auxiliary electrode; in a plane parallel to the display substrate, an edge of the auxiliary electrode is provided with a structure depressed towards a center of the auxiliary electrode.

In an exemplary embodiment, in the plane parallel to the display substrate, a shape of the auxiliary electrode includes a polygon provided with a groove.

In an exemplary embodiment, the polygon provided with the groove includes an H-shape or an X-shape.

In an exemplary embodiment, in a plane perpendicular to the display substrate, the auxiliary electrode includes a first auxiliary electrode and a second auxiliary electrode disposed on a side of the first auxiliary electrode away from the base substrate, and the first auxiliary electrode and the second auxiliary electrode which are stacked form a T-shaped structure.

In an exemplary embodiment, the light emitting structure layer further includes an organic light emitting block, the organic light emitting block is disposed on a side of the second auxiliary electrode away from the base substrate, and an orthographic projection of the organic light emitting block on the base substrate is within the range of an orthographic projection of the second auxiliary electrode in the auxiliary electrode on the base substrate; the organic light emitting block and the organic light emitting layer are disposed in a same layer and are made of a same material, and the organic light emitting block is disposed to be isolated from the organic light emitting layer.

In an exemplary embodiment, the orthographic projection of the organic light emitting block on the base substrate and an orthographic projection of the organic light emitting layer on the base substrate at least partially overlap with each other.

In an exemplary embodiment, a thickness of an edge of the organic light emitting layer close to the organic light emitting block is less than a thickness of the organic light emitting block.

In an exemplary embodiment, the cathode is in contact connection with the auxiliary electrode by wrapping the organic light emitting block and the auxiliary electrode.

In an exemplary embodiment, for the first auxiliary electrode, the second auxiliary electrode, and the organic light emitting block which are stacked, the cathode covers a surface of the organic light emitting block away from the base substrate and covers a side surface of the organic light emitting block; the cathode covers a side surface of the second auxiliary electrode and a surface of a side, adjacent to the base substrate, of a portion of the second auxiliary electrode which protrudes from the first auxiliary electrode.

In an exemplary embodiment, an orthographic projection of a cathode of the second auxiliary electrode on the side away from the base substrate and an orthographic projection of a cathode of the second auxiliary electrode on the side adjacent to the base substrate on the base substrate at least partially overlap with each other.

In an exemplary embodiment, the anode includes a first anode layer, a second anode layer disposed on a side of the first anode layer away from the base substrate, and a third anode layer disposed on a side of the second anode layer away from the base substrate; the first anode layer, the second anode layer, and the third anode layer which are stacked form an I-shape; the second anode layer and the first auxiliary electrode in the auxiliary electrode are disposed in a same layer and are made of a same material; the third anode layer and the second auxiliary electrode in the auxiliary electrode are disposed in a same layer and are made of a same material.

In an exemplary embodiment, on a plane perpendicular to the display substrate, the drive circuit layer includes: a transistor and a power supply electrode disposed on the base substrate, the power supply electrode and a drain electrode of the transistor being disposed in a same layer; a passivation layer covering the transistor and the power supply electrode, the passivation layer being provided with a first via hole and a second via hole, with the first via hole exposing the drain electrode of the transistor, and the second via hole exposing the power supply electrode; a planarization layer disposed on the passivation layer, the planarization layer being provided with an anode via hole and an auxiliary electrode via hole, with the anode via hole exposing the first via hole, and the auxiliary electrode via hole exposing the second via hole.

In an exemplary embodiment, an orthographic projection of the anode on the base substrate is within the range of an orthographic projection of the anode via hole on the base substrate; the first anode layer in the anode is connected to the drain electrode of the transistor through the first via hole; an orthographic projection of the auxiliary electrode on the base substrate is within the range of an orthographic projection of the auxiliary electrode via hole on the base substrate.

In an exemplary embodiment, the light emitting structure layer further includes a connection electrode, the connection electrode is connected to the power supply electrode through the second via hole in the auxiliary electrode via hole, and the first auxiliary electrode in the auxiliary electrode is disposed on a side of the connection electrode away from the base substrate; and the connection electrode and the first anode layer in the anode are disposed in a same layer and are made of a same material.

In an exemplary embodiment, a width of the connection electrode is greater than a width of the second auxiliary electrode.

In an exemplary embodiment, the connection electrode, the first auxiliary electrode, and the second auxiliary electrode which are stacked form an I-shape.

In an exemplary embodiment, the light emitting structure layer further includes a pixel definition layer, the pixel definition layer is provided with a first pixel opening and a second pixel opening, the first pixel opening exposes part of a surface of the third anode layer in the anode, and the second pixel opening exposes all of a surface of the second auxiliary electrode in the auxiliary electrode.

In an exemplary embodiment, in a plane parallel to the display substrate, the display substrate includes multiple sub-pixels, the multiple sub-pixels are sequentially disposed respectively along a first direction and a second direction, and the first direction and the second direction intersect with each other; in the second direction, auxiliary electrode via holes are located between anode via holes of adjacent sub-pixels.

In an exemplary embodiment, in the second direction, at least two sub-pixels are disposed between adjacent auxiliary electrode via holes.

In an exemplary embodiment, a length of the auxiliary electrode via hole in the second direction is greater than a length of the auxiliary electrode via hole in the first direction.

In an exemplary embodiment, the number of queues of the auxiliary electrode via holes arranged along the second direction is greater than the number of queues of the auxiliary electrode via holes arranged along the first direction.

The present disclosure further provides a display device, including the display substrate described above.

The present disclosure further provides a method for manufacturing a display substrate, including:
forming a drive circuit layer on a base substrate;
forming a light emitting structure layer on the drive circuit layer, wherein the light emitting structure layer includes an anode, an organic light emitting layer, a cathode, and an auxiliary electrode, the organic light emitting layer is respectively connected to the anode and the cathode, and the cathode is connected to the auxiliary electrode; in a plane parallel to the display substrate, an edge of the auxiliary electrode is provided with a structure depressed towards a center of the auxiliary electrode.

Other aspects can be understood upon reading and understanding of the drawings and the detailed description.

BRIEF DESCRIPTION OF DRAWINGS

The drawings are used to provide a further understanding of technical solutions of the present disclosure and constitute a part of the description, and are used together with the embodiments of the present disclosure to explain the technical solutions of the present disclosure without limiting the technical solutions of the present disclosure. The shapes and sizes of the components in the drawings do not reflect actual scales, and are only intended to schematically describe the contents of the present disclosure.

DETAILED DESCRIPTION

Figure 1:
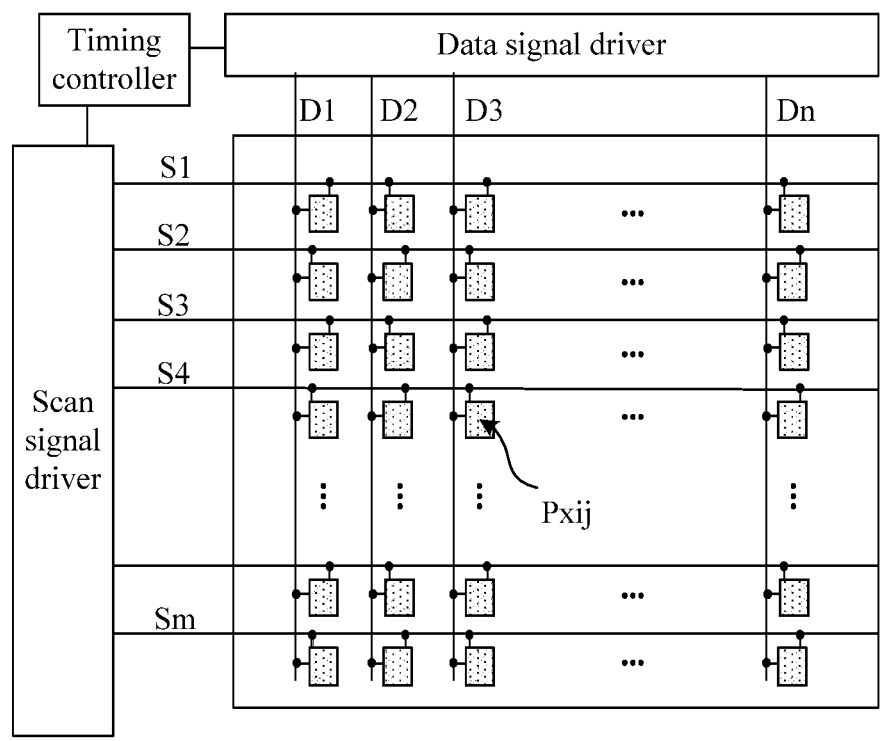
FIG. 1 is a schematic diagram of a structure of a display substrate.

In order to make purposes, technical solutions, and advantages of the present disclosure more clear, the embodiments of the present disclosure are described below in detail with reference to the drawings. It should be noted that the embodiments may be implemented in a number of different forms. It is easy for those skilled in the art to understand the fact that the embodiments and contents may be changed into various forms without departing from the purpose and scope of the present disclosure. Therefore, the present disclosure should not be interpreted as being limited to the contents recited in the following embodiments. The embodiments in the present disclosure and the features in the embodiments may be randomly combined with each other if there is no conflict.

In the drawings, sometimes for clarity, sizes of the constituent elements, and the thickness of layers or areas may be exaggerated. Therefore, any implementation of the present disclosure is not necessarily limited to the dimensions illustrated in the drawings, and the shapes and sizes of the components in the drawings do not reflect actual scales. In addition, the drawings schematically illustrate ideal examples, and any embodiment of the present disclosure is not limited to the shapes, numerical values or the like illustrated in the drawings.

In this specification, "first", "second", "third" and other ordinal numerals are configured to avoid the confusion between the constituent elements, rather than to limit the quantity.

In this specification, for convenience, wordings such as "middle", "up", "down", "front", "back", "vertical", "horizontal", "top", "bottom", "inside", and "outside" indicating the orientation or positional relations are used to describe positional relations between the constituent elements with reference to the drawings, and are only for the convenience of describing the embodiments and simplifying the description, instead of indicating or implying that the device or element referred to necessarily has a specific orientation or is constructed and operated in a specific orientation, so they should not be construed as limitations to the present disclosure. The positional relations between the constituent elements may be appropriately changed according to directions of the described constituent elements. Therefore, the wordings described herein are not restrictive, and may be appropriately replaced according to the situation.

In this specification, unless otherwise specified and limited, the terms "mount", "couple" and "connect" should be understood in a broad sense. For example, a connection may be a fixed connection, a detachable connection, or an integrated connection, may be a mechanical connection or an electrical connection, or may be a direct connection, an indirect connection through a middleware, or internal communication between two components. For those skilled in the art, the meanings of the above terms in the present disclosure may be understood according to specific situation.

In this specification, a transistor refers to a component which includes at least three terminals, i.e., a gate electrode, a drain electrode and a source electrode. The transistor has a channel region between the drain electrode drain electrode terminal, drain region or drain electrode) and the source electrode (source electrode terminal, source region or source electrode), and the current can flow through the drain electrode, the channel region and the source electrode. It should be noted that the channel region in this specification refers to a region where the current mainly flows.

In this specification, a first electrode may be a drain electrode and a second electrode may be a source electrode, or the first electrode may be a source electrode and the second electrode may be a drain electrode. Functions of "source electrode" and "drain electrode" may sometimes be exchanged when transistors of opposite polarities are used or when the current direction changes during circuit operation. Therefore, in this specification, "source electrode" and "drain electrode" are interchangeable.

In this specification, "electrical connection" includes a case where constituent elements are connected together by a component having a certain electrical action. As long as electrical signals between the connected constituent elements can be received by the "component having a certain electrical action", there is no special limitation to the "component having a certain electrical action". Examples of the "component having a certain electrical action" not only include electrodes and wirings, but also switching components such as transistors, or other functional components such as resistors, inductors and capacitors.

In this specification, "parallel" refers to a state in which an angle formed by two straight lines is above −10° and below 10°. Therefore, it also includes a state in which an angle is above −5° and below 5°. In addition, "vertical" refers to a state in which an angle formed by two straight lines is above 80° and below 100°. Therefore, it also includes a state in which an angle is above 85° and below 95°.

In this specification, "film" and "layer" are interchangeable. For example, sometimes "conducting layer" may be replaced with "conducting film". Similarly, sometimes "insulating film" may be replaced with "insulating layer".

In this specification, "about" refers to a numerical value within the range of allowable process and measurement errors without strictly limiting the limit.

FIG. 1 is a schematic diagram of a structure of a display device. Referring to FIG. 1, an OLED display device may include a timing controller, a data driver, a scan driver, and a pixel array. The pixel array may include multiple scan signal lines (51 to Sm), multiple data signal lines (D1 to Dn), and multiple sub-pixels Pxij. In an exemplary embodiment, the timing controller may provide gray scale values and a control signal suitable for the specification of the data driver to the data driver, and may provide a clock signal, a scan start signal, and the like suitable for the specification of the scan driver to the scan driver. The data driver may generate data voltages to be provided to the data signal lines D1, D2, D3 . . . and Dn using the gray scale values and the control signals received from the timing controller. For example, the data driver may sample the gray scale values by using the clock signal, and apply the data voltages corresponding to the gray scale values to the data signal lines D1 to Dn in units of sub-pixel rows, wherein n may be a natural number. The scan driver may generate scan signals to be provided to the scan signal lines S1, S2, S3 . . . and Sm by receiving the clock signal, the scan start signal, and the like from the timing controller. For example, the scan driver may sequentially provide the scan signals with on-level pulses to the scan signal lines S1 to Sm. For example, the scan driver may be constructed in the form of a shift register, and may generate the scan signal in such a way that the scan start signals provided in the form of the on-level pulses are sequentially transmitted to a next-stage circuit under the control of the clock signal, wherein m may be a natural number. The sub-pixel array may include multiple sub-pixels PXij. Each sub-pixel PXij may be connected to a corresponding data signal line and a corresponding scan signal line, wherein i and j may be natural numbers. The sub-pixel PXij may refer to a sub-pixel in which the transistor therein is connected to the i-th scan signal line and to the j-th data signal line.

Figure 2:
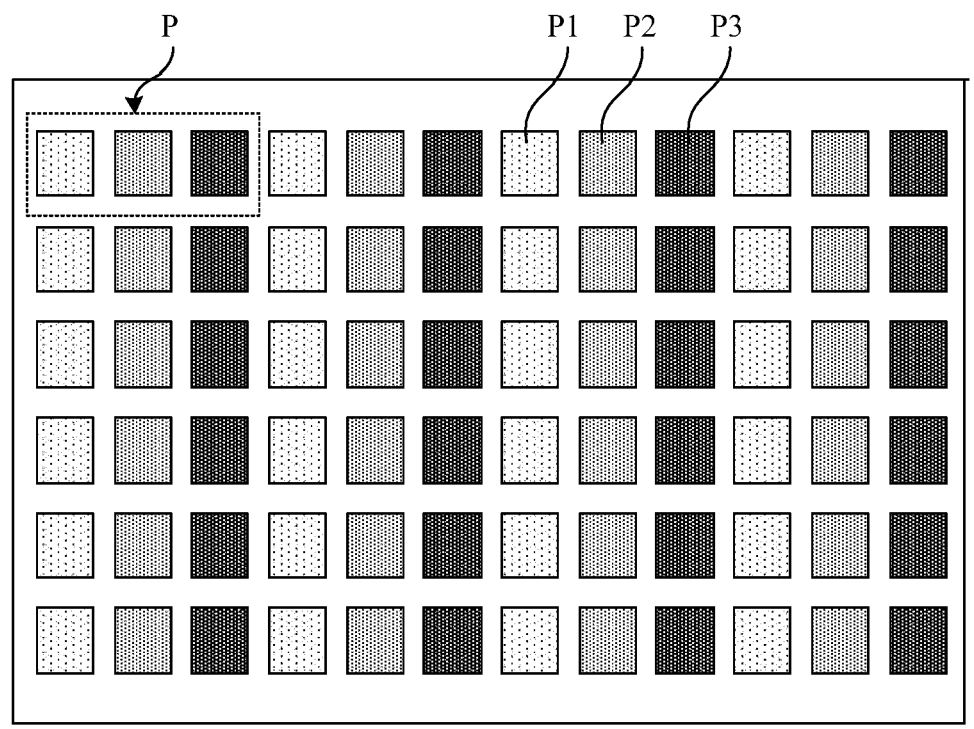
FIG. 2 is a schematic diagram of a planar structure of a display substrate.

FIG. 2 is a schematic diagram of a planar structure of a display substrate. Referring to FIG. 2, the display substrate may include multiple pixel units P arranged in an array. At least one of the multiple pixel units P includes a first light emitting unit (sub-pixel) P1 emitting light of a first color, a second light emitting unit P2 emitting light of a second color, and a third light emitting unit P3 emitting light of a third color. Each of the first light emitting unit P1, the second light emitting unit P2, and the third light emitting unit P3 includes a pixel drive circuit and a light emitting device. The pixel drive circuits in the first light emitting unit P1, the second light emitting unit P2, and the third light emitting unit P3 are respectively connected to scan signal lines, data signal lines, and light emitting signal lines. The pixel drive circuits are configured to receive the data voltages transmitted by the data signal lines and output corresponding currents to the light emitting devices under the control of the scan signal lines and the light emitting signal lines. The light emitting devices in the first light emitting unit P1, the second light emitting unit P2, and the third light emitting unit P3 are respectively connected to the pixel drive circuits of the light emitting units, and the light emitting devices are configured to emit light of corresponding brightness in response to the current outputs by the pixel drive circuits of the corresponding light emitting units.

In an exemplary embodiment, a pixel unit P may include a red (R) light emitting unit, a green (G) light emitting unit, and a blue (B) light emitting unit, or may include a red light emitting unit, a green light emitting unit, a blue light emitting unit, and a white light emitting unit, which is not limited in the present disclosure. In an exemplary embodiment, a shape of the light emitting units in the pixel unit may be a rectangle, a rhombus, a pentagon, or a hexagon. When the pixel unit includes three light emitting units, the three light emitting units may be arranged in parallel horizontally, in parallel vertically, or in a regular triangle shape. When the pixel unit includes four light emitting units, the four light emitting units may be arranged in parallel horizontally, in parallel vertically, or a square shape, which is not limited in the present disclosure.

Figure 3:
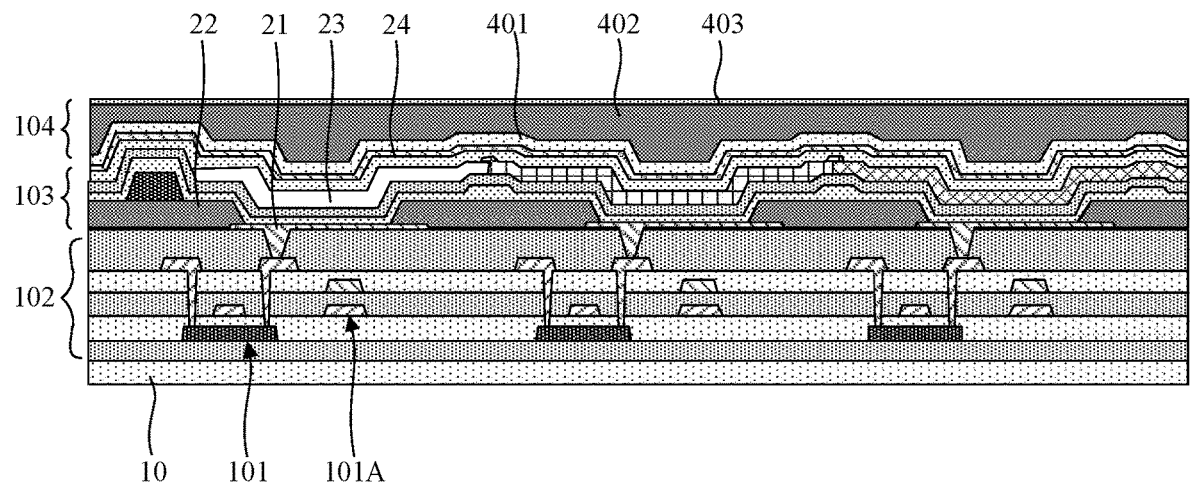
FIG. 3 is a schematic diagram of a sectional structure of a display substrate.

FIG. 3 is a schematic diagram of a sectional structure of a display substrate, which illustrates a structure of three sub-pixels of an OLED display substrate. Referring to FIG. 3, on a plane perpendicular to the display substrate, the display substrate may include a drive circuit layer 102 disposed on a base substrate 10, a light emitting structure layer 103 disposed on a side of the drive circuit layer 102 away from the base substrate 10, and an encapsulation layer 104 disposed on a side of the light emitting structure layer 103 away from the base substrate 10. In some possible implementations, the display substrate may include other film layers, such as a spacer post, which is not limited in the present disclosure.

In an exemplary embodiment, the base substrate 10 may be a flexible substrate or may be a rigid substrate. The drive circuit layer 102 of each sub-pixel may include multiple transistors and storage capacitors forming a pixel drive circuit. In FIG. 3, illustration is made by taking each sub-pixel including one transistor 101 and one storage capacitor 101A as an example. The light emitting structure layer 103 may include an anode 21, a pixel definition layer 22, an organic light emitting layer 23, and a cathode 24. The anode 21 is connected to a drain electrode of the transistor 101 by a via hole. The organic light emitting layer 23 is connected to the anode 21, the cathode 24 is connected to the organic light emitting layer 23, and the organic light emitting layer 23 emits light of a corresponding color under the drive of the anode 21 and the cathode 24. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

Figure 4:
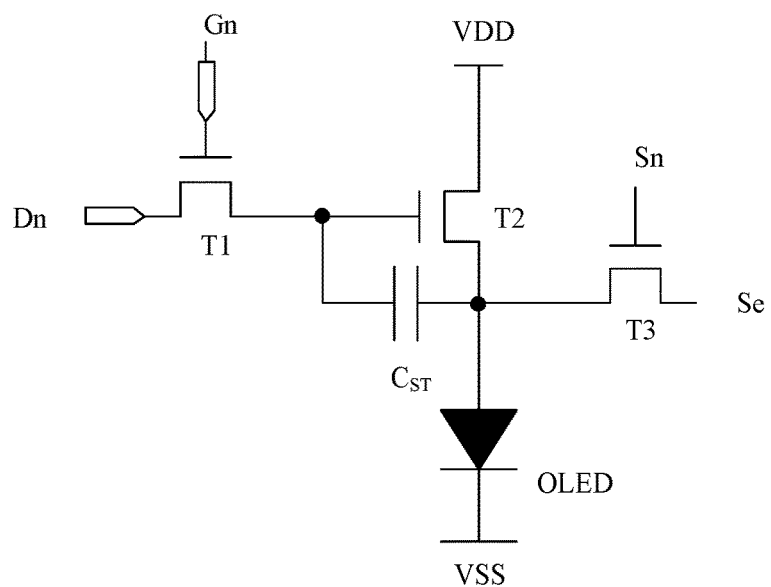
FIG. 4 is a schematic diagram of an equivalent circuit of a pixel drive circuit.

In an exemplary embodiment, the pixel drive circuit may have a 3T1C, 4T1C, 5T1C, 5T2C, 6T1C, or 7T1C structure. FIG. 4 is a schematic diagram of an equivalent circuit of a pixel drive circuit. As shown in FIG. 4, the pixel drive circuit has a 3T1C structure, which may include three switching transistors (a first transistor T1, a second transistor T2, and a third transistor T3), one storage capacitor $C_{ST}$, and six signal lines (a data line Dn, a first scan line Gn, a second scan line Sn, a compensation line Se, a first power supply line VDD, and a second power supply line VSS). In an exemplary embodiment, the first transistor T1 is a switching transistor, the second transistor T2 is a drive transistor, and the third transistor T3 is a compensation transistor. A gate electrode of the first transistor T1 is coupled to the first scan line Gn, a first electrode of the first transistor T1 is coupled to the data line Dn, a second electrode of the first transistor T1 is coupled to a gate electrode of the second transistor T2. The first transistor T1 is configured to receive a data signal transmitted by the data line Dn under the control of the first scan line Gn, so that the gate electrode of the second transistor T2 receives the data signal. The gate electrode of the second transistor T2 is coupled to the second electrode of the first transistor T1, a first electrode of the second transistor T2 is coupled to the first power supply line VDD, a second electrode of the second transistor T2 is coupled to a first electrode of an OLED, and the second transistor T2 is configured to generate a corresponding current at the second electrode under the control of the data signal received by the gate electrode of the second transistor. A gate electrode of the third transistor T3 is coupled to the second scan line Sn, a first electrode of the third transistor T3 is connected to the compensation line Se, a second electrode of the third transistor T3 is coupled to the second electrode of the second transistor T2. The third transistor T3 is configured to extract a threshold voltage Vth and the mobility of the second transistor T2 in response to compensation timing to compensate the threshold voltage Vth. The first electrode of the OLED is coupled to the second electrode of the second transistor T2, a second electrode of the OLED is coupled to the second power supply line VSS, and the OLED is configured to emit light with corresponding brightness in response to the current of the second electrode of the second transistor T2. A first electrode of the storage capacitor $C_{ST}$ is coupled to the gate electrode of the second transistor T2, a second electrode of the storage capacitor $C_{ST}$ is coupled to the second electrode of the second transistor T2, and the storage capacitor $C_{ST}$ is configured to store a potential of the gate electrode of the second transistor T2.

In an exemplary embodiment, a signal of the first power supply line VDD is a high-level signal continuously provided, and a signal of the second power supply line VSS is a low-level signal. The first transistor T1 to the third transistor T3 may be P-type transistors or may be N-type transistors. The use of the same type of transistors in the pixel drive circuit can simplify the process flow, reduce the process difficulty of a display panel, and improve the product yield. In some possible implementations, the first transistor T1 to the third transistor T3 may include a P-type transistor and an N-type transistor. In an exemplary embodiment, the light emitting device may be an Organic Light Emitting Diode (OLED), including a first electrode (anode), an organic light emitting layer, and a second electrode (cathode) which are stacked.

According to a light exit direction, the OLED display substrates may be classified into three types, including a bottom emission OLED, a top emission OLED, and a double-sided emission OLED. The bottom emission OLED emits light from the bottom direction of the substrate, and the top emission OLED emits light from the top direction of the substrate. The double-sided emission OLED emits light from both the bottom direction of the substrate and the top direction of the substrate. Compared with the bottom emission OLED, the top emission OLED has advantages such as high aperture ratio, high color purity, and easiness in achieving high resolution, i.e., pixels per inch (PPI), and thus attracts much attention of people.

For the top emission OLED, since the light emission direction is on a side of the cathode, the cathode is required to have good light transmittance and conductivity, but it is very difficult to satisfy the requirements on the light transmittance and conductivity at the same time. For example, in order to satisfy the requirements on the conductivity, the thickness of the cathode is necessarily required to be relatively large, but the transmittance of the cathode is relatively low in this case, leading to a problem of a view angle color cast. In order to satisfy the requirement on the light transmittance, the thickness of the cathode is necessarily required to be relatively small, but the impedance of the cathode is relatively large in this case, not only leading to problems of increase of voltage and power consumption, but also leading to problems of uneven voltage distribution at different positions on the cathode and uneven brightness.

In a top emission OLED display substrate, in order to reduce a cathode voltage drop, an auxiliary electrode is disposed to reduce the impedance of the cathode, so as to reduce the cathode voltage drop. In the display substrate, the auxiliary electrode is disposed on the drive circuit layer, the cathode is disposed on the light emitting structure layer, and a via hole is formed in the drive circuit layer and the light emitting structure layer by a laser process, so that the cathode is connected to the auxiliary electrode by the via hole. Since a large number of particles are produced in the laser process for forming the via hole in the organic light emitting layer, the structure and process seriously affect the product yield. The structure and process greatly reduce the production efficiency since the use of the laser process increases the tact time. Since the via hole formed by the laser process is relatively small and a contact area between the cathode and the auxiliary electrode is relatively small, the structure and process cannot effectively reduce the cathode voltage drop, thus affecting the display effect.

Figure 5:
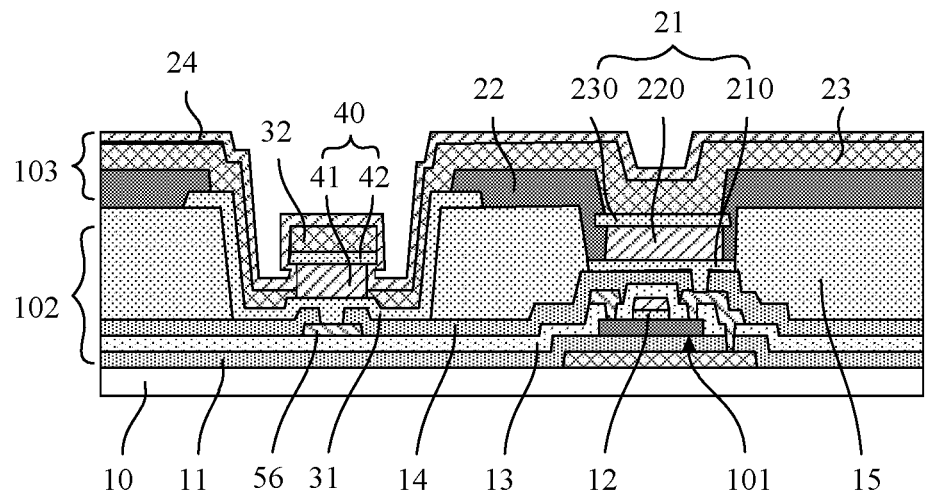
FIG. 5 is a schematic diagram of a structure of a display substrate according to an exemplary embodiment of the present disclosure.

FIG. 5 is a schematic diagram of a structure of a display substrate according to an exemplary embodiment of the present disclosure, which illustrates a sectional structure of one sub-pixel in the display substrate. Referring to FIG. 5, in an exemplary embodiment, in a plane perpendicular to the display substrate, the display substrate may include a drive circuit layer 102 disposed on the base substrate 10 and a light emitting structure layer 103 disposed on a side of the drive circuit layer 102 away from the base substrate 10. The drive circuit layer 102 may include a power supply electrode 56 and a transistor 101 forming a pixel drive circuit. The light emitting structure layer 103 may include an anode 21, a pixel definition layer 22, an organic light emitting layer 23, a cathode 24, and an auxiliary electrode 40. The anode 21 is connected to a drain electrode of the transistor 101, the organic light emitting layer 23 is respectively connected to the anode 21 and the cathode 24, the cathode 24 is connected to the auxiliary electrode 40, and the auxiliary electrode 40 is connected to the power supply electrode 56.

In an exemplary embodiment, in a plane perpendicular to the display substrate, the auxiliary electrode 40 may include a first auxiliary electrode 41 and a second auxiliary electrode 42 disposed on a side of the first auxiliary electrode 41 away from the base substrate. The stacked first auxiliary electrode 41 and second auxiliary electrode 42 form a T-shaped structure, that is, an orthographic projection of the first auxiliary electrode 41 on the base substrate is within the range of an orthographic projection of the second auxiliary electrode 42 on the base substrate.

In an exemplary embodiment, the light emitting structure layer 103 further includes an organic light emitting block 32, wherein the organic light emitting block 32 is disposed on a side of the auxiliary electrode 40 away from the base substrate, and the organic light emitting block 32 is disposed to be isolated from the organic light emitting layer 23.

In an exemplary embodiment, the organic light emitting block 32 is disposed on a side of the second auxiliary electrode 42 away from the base substrate, and an orthographic projection of the organic light emitting block 32 on the base substrate is within the range of the orthographic projection of the second auxiliary electrode 42 on the base substrate.

In an exemplary embodiment, the orthographic projection of the organic light emitting block 32 on the base substrate and an orthographic projection of the organic light emitting layer 23 on the base substrate at least partially overlap.

In an exemplary embodiment, the thickness of an edge of the organic light emitting layer 23 close to the organic light emitting block 32 is less than the thickness of the organic light emitting block 32.

In an exemplary embodiment, in a plane perpendicular to the display substrate, the anode 21 may include a first anode layer 210, a second anode layer 220 disposed on a side of the first anode layer 210 away from the base substrate, and a third anode layer 230 disposed on a side of the second anode layer 220 away from the base substrate. The stacked first anode layer 210, second anode layer 220, and third anode layer 230 form an I-shape, that is, an orthographic projection of the second anode layer 220 on the base substrate is within the range of an orthographic projection of the first anode layer 210 on the base substrate, and the orthographic projection of the second anode layer 220 on the base substrate is within the range of an orthographic projection of the third anode layer 230 on the base substrate. In an exemplary embodiment, the first anode layer 210 is connected to the drain electrode of the transistor 101 through a via hole.

In an exemplary embodiment, the first auxiliary electrode 41 and the second anode layer 220 are disposed in a same layer, are made of a same material, and are formed simultaneously through a same patterning process.

In an exemplary embodiment, the second auxiliary electrode 42 and the third anode layer 230 are disposed in a same layer, are made of a same material, and are formed simultaneously through the same patterning process.

In an exemplary embodiment, the light emitting structure layer 103 further includes a connection electrode 31, wherein the connection electrode 31 is connected to the power supply electrode 56 in the drive circuit layer 102 by a via hole, and the first auxiliary electrode 41 in the auxiliary electrode 40 is disposed on a side of the connection electrode 31 away from the base substrate to realize the connection between the auxiliary electrode 40 and the power supply electrode 56.

In an exemplary embodiment, the connection electrode 31 and the first anode layer 210 are disposed in a same layer, are made of a same material, and are formed simultaneously through a same patterning process.

In an exemplary embodiment, the width of the connection electrode 31 is greater than the width of the second auxiliary electrode 42.

In an exemplary embodiment, the connection electrode 31, the first auxiliary electrode 41, and the second auxiliary electrode 42 may be referred to as auxiliary electrodes, and the stacked connection electrode 31, first auxiliary electrode 42, and second auxiliary electrode 43 form an I-shape.

In an exemplary embodiment, the drive circuit layer 102 may include the power supply electrode 56 and the transistor 101, wherein the power supply electrode 56 and a source electrode and a drain electrode in the transistor 101 are disposed in a same layer, are made of a same material, and are formed simultaneously through a same patterning process.

In an exemplary embodiment, the drive circuit layer 102 may include a fourth insulating layer (passivation layer) 14 and a planarization layer 15. The fourth insulating layer 14 covers the power supply electrode 56 and the transistor 101, and is provided thereon with a first via hole and a second via hole. The first via hole exposes the drain electrode in the transistor 101, and the second via hole exposes the power supply electrode 56. The planarization layer 15 is disposed on the fourth insulating layer 14, and is provided with an anode via hole and an auxiliary electrode via hole. The anode via hole exposes the first via hole and the fourth insulating layer 14 in a region close to the first via hole, so that the first anode layer 210 is connected to the drain electrode of the transistor 101 through the anode via hole and the first via hole. The auxiliary electrode via hole exposes the second via hole and the fourth insulating layer 14 in a region close to the second via hole, so that the connection electrode 31 is connected to the power supply electrode 56 through the auxiliary electrode via hole and the second via hole.

In an exemplary embodiment, the first anode layer 210 is located in the anode via hole, and an orthographic projection of the first anode layer 210 on the base substrate is within the range of an orthographic projection of the anode via hole on the base substrate.

In an exemplary embodiment, the auxiliary electrode 40 is located in the auxiliary electrode via hole, and an orthographic projection of the auxiliary electrode 40 on the base substrate is within the range of an orthographic projection of the auxiliary electrode via hole on the base substrate.

In an exemplary embodiment, the pixel definition layer 22 in the light emitting structure layer 103 is provided with a first pixel opening and a second pixel opening, wherein the first pixel opening exposes part of a surface of the third anode layer 230, and the second pixel opening exposes all the surface of the second auxiliary electrode 42.

In an exemplary embodiment, the cathode 24 in the light emitting structure layer 103 is in large-area contact connection with the auxiliary electrode 40 by wrapping the organic light emitting block 32 and the auxiliary electrode 40.

In an exemplary embodiment, for the first auxiliary electrode 42, the second auxiliary electrode 42, and the organic light emitting block 32 which are stacked in a direction away from the base substrate, exposed surfaces of the organic light emitting block 32 include: an upper surface on a side away from the base substrate and a side surface on a lateral side; exposed surfaces of the second auxiliary electrode 42 include: a second side surface on a lateral side and a second lower surface on a side, adjacent to the base substrate, of a portion of the second auxiliary electrode which protrudes from the first auxiliary electrode 41; and an exposed surface of the first auxiliary electrode 41 includes: a first side surface on a lateral side. In an exemplary embodiment, the side surfaces refer to multiple circumferential surfaces each having the normal direction being parallel or nearly parallel to the plane of the base substrate. The cathode 24 wrapping the organic light emitting block 32 and the auxiliary electrode 40 refers to the cathode 24 covering the upper surface and all of the side surfaces of the organic light emitting block 32 and the cathode 24 covering both of the second side surface and second lower surface of the second auxiliary electrode 42.

In an exemplary embodiment, orthographic projections of the cathode 24 on the side of the second auxiliary electrode 42 away from the base substrate and the cathode 24 on the side of the second auxiliary electrode 42 adjacent to the base substrate on the base substrate at least partially overlap.

In an exemplary embodiment, in a plane parallel to the display substrate, an edge of the auxiliary electrode 40 is provided with a structure recessed towards the center of the auxiliary electrode.

In an exemplary embodiment, the shape of the auxiliary electrode 40 includes a polygon provided with a groove on an edge thereof.

In an exemplary embodiment, the polygon provided with the groove may include an H-shape or an X-shape.

An exemplary description is performed below through a process of manufacturing the display substrate. For metal materials, inorganic materials, or transparent conducting materials, the "patterning process" mentioned in the present disclosure includes treatments such as photoresist coating, mask exposure, development, etching, and photoresist stripping, and for organic materials, the "patterning process" includes treatments such as organic material coating, mask exposure, and development. Deposition may be implemented by adopting any one or more of sputtering, evaporation, and chemical vapor deposition, coating may be implemented by adopting any one or more of spray coating, spin coating, and inkjet printing, and etching may be implemented by adopting any one or more of dry etching and wet etching, which is not limited in the present disclosure. "Thin film" refers to a layer of thin film made of a certain material on a base substrate by deposition, coating, or other processes. If the "thin film" does not require a patterning process in the whole manufacturing process, the "thin film" may also be referred to as "layer". If the "thin film" requires a patterning process in the whole manufacturing process, the "thin film" is referred to as "thin film" before the patterning process and is referred to as "layer" after the patterning process. The "layer" obtained after the patterning process includes at least one "pattern". "A and B are disposed in a same layer" in the present disclosure refers to forming A and B simultaneously through a same patterning process, and the "thickness" of the film layer is a dimension of the film layer in a direction perpendicular to the display substrate. In an exemplary embodiment of the present disclosure, "an orthographic projection of B is within the range of an orthographic projection of A" refers to the boundary of the orthographic projection of B falling within the boundary range of the orthographic projection of A, or the boundary of the orthographic projection of A overlaps with the boundary of the orthographic projection of B.

In an exemplary embodiment, a process of manufacturing a display substrate may include the following operations.

(1) A base substrate is provided. In an exemplary embodiment, the base substrate may be a flexible substrate or may be a rigid substrate. In an exemplary embodiment, the flexible substrate may include a first flexible material layer, a first inorganic material layer, a semiconductor layer, a second flexible material layer, and a second inorganic material layer which are stacked. Materials of the first and second flexible material layers may be polyimide (PI), polyethylene terephthalate (PET), or a polymer soft film subjected to surface treatment, etc. Materials of the first and second inorganic material layers may be silicon nitride (SiNx), silicon oxide (SiOx), or the like, so as to improve water-oxygen resistance capability of the base substrate. The first and second inorganic material layers are also referred to as barrier layers. A material of the semiconductor layer may be amorphous silicon (a-si). In an exemplary embodiment, taking a stacked structure as an example, a manufacturing process thereof may include: first, coating a layer of polyimide on a glass carrier plate, and forming a first flexible (PI1) layer after curing for film formation; depositing a layer of barrier thin film on the first flexible layer to form a first barrier (Barrier 1) layer covering the first flexible layer; depositing a layer of amorphous silicon thin film on the first barrier layer to form an amorphous silicon (a-si) layer covering the first barrier layer; coating a layer of polyimide on the amorphous silicon layer, and forming a second flexible (PI2) layer after curing for film formation; and then depositing a layer of barrier thin film on the second flexible layer to form a second barrier (Barrier 2) layer covering the second flexible layer, till which the manufacturing of the base substrate is completed.

Figure 6:
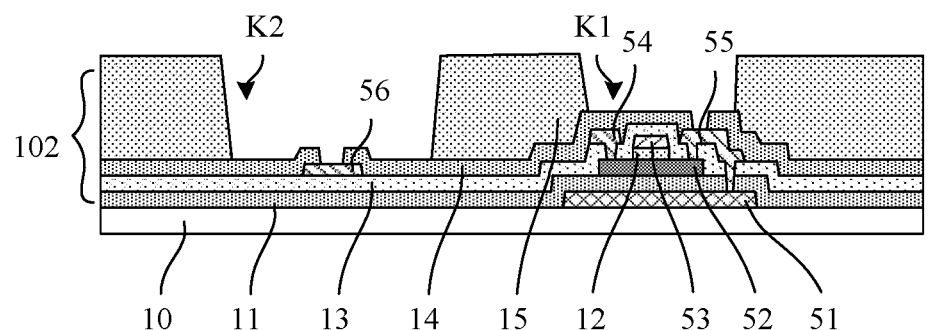
FIG. 6 is a schematic diagram in which a pattern of a drive circuit layer is formed according to an exemplary embodiment of the present disclosure.

(2) A pattern of a drive circuit layer is formed on the base substrate, as illustrated in FIG. 6. In an exemplary embodiment, a process of manufacturing a drive circuit layer may include:

A barrier thin film is deposited on the base substrate 10, and the barrier thin film is patterned by a patterning process to form a pattern of a barrier layer 51 on the base substrate 10.

Then, a first insulating thin film and a semiconductor thin film are deposited sequentially, and the semiconductor thin film is patterned by a patterning process to form a first insulating layer 11 covering the pattern of the barrier layer and a pattern of a semiconductor layer disposed on the first insulating layer 11. The pattern of the semiconductor layer at least includes an active layer 52, wherein an orthographic projection of the active layer 52 on the base substrate is within the range of an orthographic projection of the barrier layer 51 on the base substrate.

Then, a second insulating thin film and a first metal thin film are deposited sequentially, the first metal thin film is patterned by a patterning process to form a second insulating layer 12 disposed on the pattern of the semiconductor layer and form a pattern of a first metal layer disposed on the second insulating layer 12. The pattern of the first metal layer at least includes a gate electrode 53, wherein an orthographic projection of the second insulating layer 12 on the base substrate is within the range of the orthographic projection of the active layer 52 on the base substrate, and an orthographic projection of the gate electrode 53 on the base substrate is within the range of the orthographic projection of the second insulating layer 12 on the base substrate.

Then, a third insulating thin film is deposited, and the third insulating thin film is patterned by a patterning process to form a third insulating layer 13 covering the pattern of the first metal layer, wherein the third insulating layer 13 is provided with a pattern of active via holes and a barrier via hole. Two active via holes are located at the positions of two ends of the active layer 52, and the third insulating layer 13 in the active via holes is etched to expose a surface of the active layer 52. At least one barrier via hole is located at the position of an edge of the barrier layer 51, and the third insulating layer 13 and the first insulating layer 11 in the barrier via hole are etched to expose a surface of the barrier layer 51.

Then, a second metal thin film is deposited, and the second metal thin film is patterned by a patterning process to form a pattern of a second metal layer on the third insulating layer 13, wherein the pattern of the second metal layer at least includes a source electrode 54, a drain electrode 55, and a power supply electrode 56. The source electrode 54 and the drain electrode 55 are separately connected to the active layer 52 through the active via holes, and the drain electrode 55 is connected to the barrier layer 51 through of the barrier via hole.

Then, a fourth insulating thin film is deposited, and the fourth insulating thin film is patterned by patterning process to form a fourth insulating layer 14 covering the pattern of the second metal layer. The fourth insulating layer 14 is provided with a pattern of a first via hole and a second via hole, wherein the fourth insulating layer 14 in the first via hole is etched to expose a surface of the drain electrode 55, and the fourth insulating layer 14 in the second via hole is etched to expose a surface of the power supply electrode 56.

Then, a planarization thin film is coated, and the planarization thin film is patterned by a patterning process to form a planarization layer 15 on the fourth insulating layer 14, wherein the planarization layer 15 is provided with a pattern of an anode via hole K1 and an auxiliary electrode via hole K2. The planarization layer 15 in the anode via hole K1 is removed to expose the first via hole and the fourth insulating layer 14 in a region close to the first via hole, and the first via hole exposes the surface of the drain electrode 55. The planarization layer 15 in the auxiliary electrode via hole K2 is removed to expose the second via hole and the fourth insulating layer 14 in a region close to the second via hole, and the second via hole exposes the surface of the power supply electrode 56.

In an exemplary embodiment, since the planarization layer 15 is provided with the auxiliary electrode via hole K2, the auxiliary electrode via hole K2 may be used as a vent channel to discharge gas generated by the planarization layer in the process, so as to avoid peeling of film layers and improve the process quality.

So far, the pattern of the drive circuit layer 102 is formed on the base substrate 10, as illustrated in FIG. 6. In an exemplary embodiment, the active layer 52, the gate electrode 53, the source electrode 54, and the drain electrode 55 form a transistor 101, and the power supply electrode 56 may be connected to the second power supply line VSS. In an exemplary embodiment, the transistor may be a drive transistor in a pixel drive circuit, and the drive transistor may be a thin film transistor.

In an exemplary embodiment, the first insulating layer, the second insulating layer, the third insulating layer, and the fourth insulating layer may be made of any one or more of silicon oxide (SiOx), silicon nitride (SiNx), and silicon nitride (SiON), and each may be in a single layer structure, a multi-layer structure, or a composite layer structure. The first insulating layer is referred to as a buffer layer, the second insulating layer is referred to as a gate insulating (GI) layer, the third insulating layer is referred to as an interlayer dielectric (ILD) layer, and the fourth insulating layer is referred to as a passivation (PVX) layer. The planarization thin film may be made of an organic material such as resin. The first metal thin film and the second metal thin film may be made of a metal material, such as any one or more of silver (Ag), copper (Cu), aluminum (Al), titanium (Ti), and molybdenum (Mo), or an alloy material of the above metals, such as aluminum neodymium alloy (AlNd) or molybdenum niobium alloy (MoNb), and may be in a single-layer structure or multi-layer composite structure, such as Ti/Al/Ti. The barrier thin film may be made of a metal material or a non-metal material which is opaque to light. The active layer thin film may be made of amorphous indium gallium zinc oxide (a-IGZO), zinc nitride (ZnO), indium zinc tin oxide (IZTO), amorphous silicon (a-Si), polycrystalline silicon (p-Si), hexathiophene, polythiophene, and other materials, that is, the present disclosure is applicable to transistors manufactured on the basis of an oxide technology, a silicon technology, and an organic matter technology.

Figure 7:
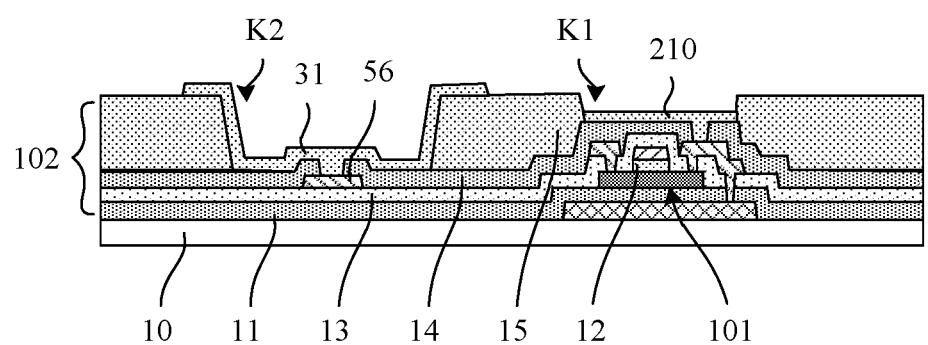
FIG. 7 is a schematic diagram in which a pattern of a first conducting layer is formed according to an exemplary embodiment of the present disclosure.

(3) A pattern of a first conducting layer is formed. In an exemplary embodiment, the formation of the pattern of the first conducting layer may include: depositing a first transparent conducting thin film on the base substrate on which the above patterns are formed, and patterning the first transparent conducting thin film by a patterning process to form the pattern of the first conducting layer. The pattern of the first conducting layer at least includes a first anode layer 210 and a connection electrode 31, the first anode layer 210 is disposed on the fourth insulating layer 14 in the anode via hole K1 and is connected to the drain electrode of the transistor 101 through the first via hole, and the connection electrode 31 is disposed on the fourth insulating layer 14 in the auxiliary electrode via hole K2 and is connected to the power supply electrode 56 through the second via hole, as illustrated in FIG. 7.

In an exemplary embodiment, the first transparent conducting thin film may be made of indium tin oxide (ITO) or indium zinc oxide (IZO), etc., the first anode layer 210 may be completely located within the anode via hole K1, and the area of the first anode layer 210 may be less than the area of the anode via hole K1, that is, an orthographic projection of the first anode layer 210 on the base substrate is within the range of an orthographic projection of the anode via hole K1 on the base substrate.

In an exemplary embodiment, the connection electrode 31 may be completely located within the auxiliary electrode via hole K2, that is, an orthographic projection of the connection electrode 31 on the base substrate is within the range of an orthographic projection of the auxiliary electrode via hole K2 on the base substrate. In an exemplary embodiment, one portion of the connection electrode 31 may be located in the auxiliary electrode via hole K2, and the other portion may be located on the planarization layer 15 outside the auxiliary electrode via hole K2, that is, the orthographic projection of the auxiliary electrode via hole K2 on the base substrate is within the range of the orthographic projection of the connection electrode 31 on the base substrate.

(4) Patterns of an anode and an auxiliary electrode are formed. In an exemplary embodiment, the formation of the patterns of the anode and the auxiliary electrode may include: sequentially forming a third metal thin film and a second transparent conducting thin film on the base substrate on which the above patterns are formed, and patterning the third metal thin film and the second transparent conducting thin film by a patterning process to form patterns of a second anode layer 220, a third anode layer 230, a first auxiliary electrode 41, and a second auxiliary electrode 42. The second anode layer 220 is disposed in the anode via hole K1 on a side of the first anode layer 210 away from the base substrate and is connected to the first anode layer 210, the third anode layer 230 is disposed on a side of the second anode layer 220 away from the base substrate and is connected to the second anode layer 220, the first auxiliary electrode 41 is disposed in the auxiliary electrode via hole K2 on a side of the connection electrode 31 away from the base substrate and is connected to the connection electrode 31, and the second auxiliary electrode 42 is disposed on a side of the first auxiliary electrode 41 away from the base substrate and is connected to the first auxiliary electrode 41. The stacked first anode layer 210, second anode layer 220, and third anode layer 230 form an anode 21, and the stacked first auxiliary electrode 41 and second auxiliary electrode 42 form an auxiliary electrode 40, as illustrated in FIG. 8.

In an exemplary embodiment, an orthographic projection of the second anode layer 220 on the base substrate may be within the range of an orthographic projection of the first anode layer 210 on the base substrate, and the orthographic projection of the second anode layer 220 on the base substrate may be within the range of an orthographic projection of the third anode layer 230 on the base substrate. An orthographic projection of the first auxiliary electrode 41 on the base substrate may be within the range of an orthographic projection of the second auxiliary electrode 42 on the base substrate, the orthographic projection of the second auxiliary electrode 42 on the base substrate may be within the range of the orthographic projection of the auxiliary electrode via hole K2 on the base substrate, and the orthographic projection of the second auxiliary electrode 42 on the base substrate may be within the range of the orthographic projection of the connection electrode 31 on the base substrate, that is, the width of the connection electrode 31 is greater than the width of the second auxiliary electrode 42.

Figure 8:
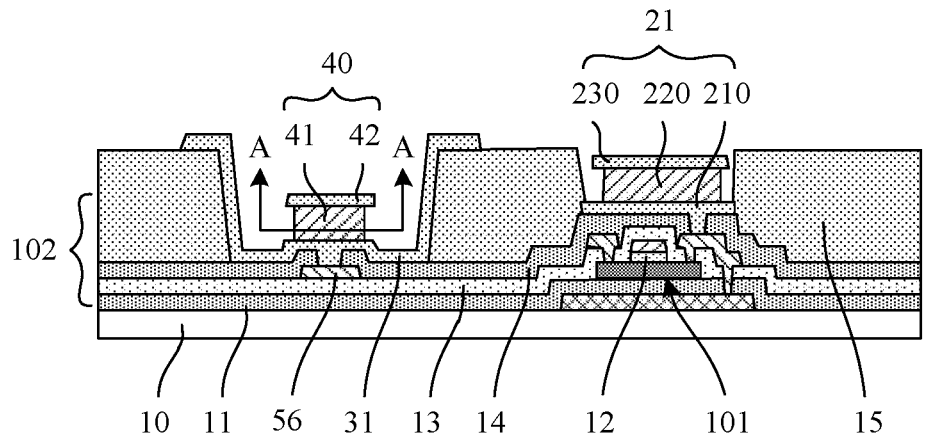
FIG. 8 is a schematic diagram in which a pattern of an anode and an auxiliary electrode is formed according to an exemplary embodiment of the present disclosure.
Figure 9:
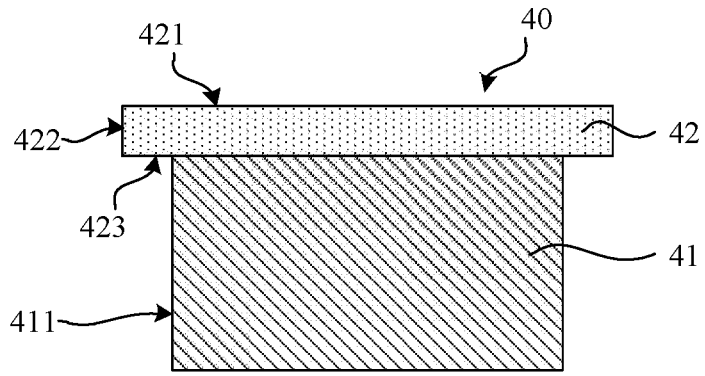
FIG. 9 is a sectional schematic diagram of an auxiliary electrode according to an embodiment of the present disclosure.

FIG. 9 is a sectional schematic diagram of an auxiliary electrode according to an embodiment of the present disclosure, and is an enlarged view of the auxiliary electrode in FIG. 8. Referring to FIG. 9, in a plane perpendicular to the display substrate, the second auxiliary electrode 42 on a side (upper side) of the first auxiliary electrode 41 away from the base substrate has an edge protruding from the contour of the first auxiliary electrode 41, forming an "eave" structure, so that the stacked first electrode and first auxiliary electrode 41 form a T-shape.

Figure 10:
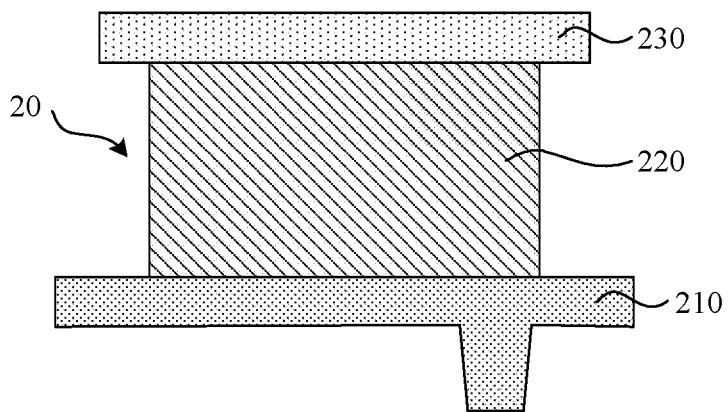
FIG. 10 is a sectional schematic diagram of an anode according to an embodiment of the present disclosure.

FIG. 10 is a sectional schematic diagram of an anode according to an embodiment of the present disclosure, and is an enlarged view of the anode in FIG. 8. Referring to FIG. 10, in a plane perpendicular to the display substrate, the first anode layer 210 on a side (lower side) of the second anode layer 220 adjacent to the base substrate has an edge protruding from the contour of the second anode layer 220, forming a "base" structure, and the third anode layer 230 on a side (upper side) of the second anode layer 220 away from the base substrate has an edge protruding from the contour of the second anode layer 220, forming an "eave" structure, so that the stacked first anode layer 210, second anode layer 220, and third anode layer 230 form an I-shape.

In an exemplary embodiment, the orthographic projection of the third anode layer 230 on the base substrate may be within the range of the orthographic projection of the anode via hole K1 on the base substrate. For example, edges on two sides of the third anode layer 230 may be in contact with the sidewall of the anode via hole K1.

In an exemplary embodiment, in a process of patterning the third metal thin film and the second transparent conducting thin film, a first etchant and a second etchant may be used separately for etching, and the T-shape of the auxiliary electrode and the I-shape of the anode may be formed by drilling. In an exemplary embodiment, the first etchant may be an etchant (ITO etchant) for etching a transparent conducting material, and the second etchant may be an etchant (metal etchant) for etching a metal material. In an exemplary embodiment, after a photoresist pattern is formed through masking, exposure, and development of the photoresist, an etching process may include: first etching the second transparent conducting thin film not covered by the photoresist by using the ITO etchant, to expose the third metal thin film in a region not covered by the photoresist and form patterns of the third anode layer 230 and the second auxiliary electrode 42; and then etching the exposed third metal thin film by using the metal etchant, to form patterns of the second anode layer 220 and the first auxiliary electrode 41. Since a rate of etching the third metal thin film by using the metal etchant is greater than a rate of etching the first transparent conducting thin film and the second transparent conducting thin film, side surfaces of the second anode layer 220 and the first auxiliary electrode 41 are etched to form recesses. The first anode layer 210 below the second anode layer 220 and the third anode layer 230 above the second anode layer 220 both protrude from the second anode layer 220 for a certain distance to form an I-shaped structure. The second auxiliary electrode 42 above the first auxiliary electrode 41 protrudes from the first auxiliary electrode 41 for a certain distance to form a T-shaped structure.

As illustrated in FIG. 9, on the plane perpendicular to the display substrate, the formed auxiliary electrode 40 has multiple exposed surfaces, and these exposed surfaces respectively include:

a first side surface 411 on a lateral side of the first auxiliary electrode 41, a second upper surface 421 on an upper side (the side away from the base substrate) of the second auxiliary electrode 42, a second side surface 422 on a lateral side of the second auxiliary electrode 42, and a second lower surface 423 on a lower side (the side adjacent to the base substrate) of the second auxiliary electrode 42. The second lower surface 423 refers to a surface on a side, adjacent to the base substrate, of a portion of the second auxiliary electrode 42 which protrudes from the first auxiliary electrode 41. In an exemplary embodiment, the aforementioned side surfaces refer to multiple circumferential surfaces each having a normal direction being parallel or nearly parallel to the plane of the base substrate. For example, in a plane parallel to the base substrate, the first side surface 411 of the rectangular first auxiliary electrode 41 includes four circumferential surfaces.

In an exemplary embodiment, on a plane parallel to the display substrate, an edge of the auxiliary electrode 40 may be provided with a structure depressed towards the center of the auxiliary electrode. In an exemplary embodiment, the shape of the auxiliary electrode 40 may include a polygon provided with a groove. In an exemplary embodiment, the polygon provided with the groove may include an H-shape or an X-shape.

Figure 11A:
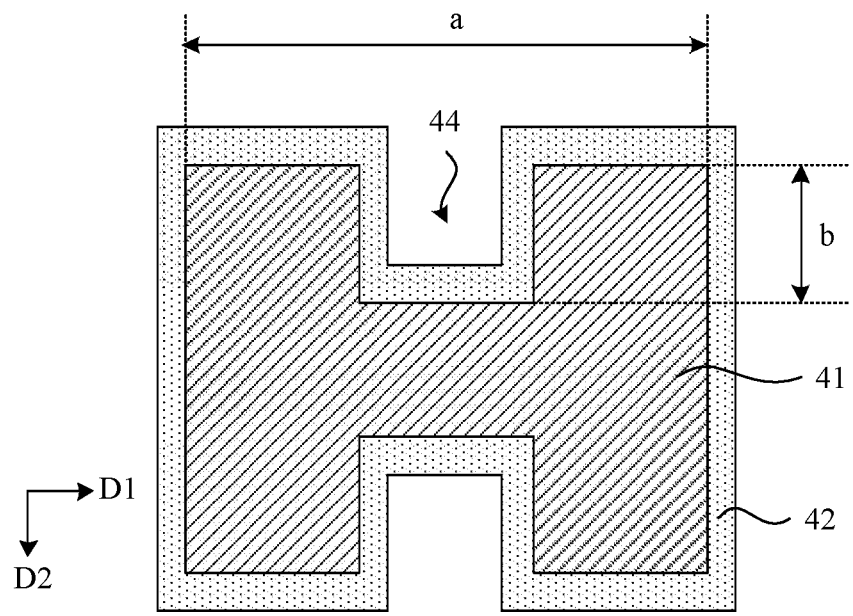
FIG. 11a and FIG. 11b are planar schematic diagrams of two auxiliary electrodes according to an embodiment of the present disclosure.
Figure 11B:
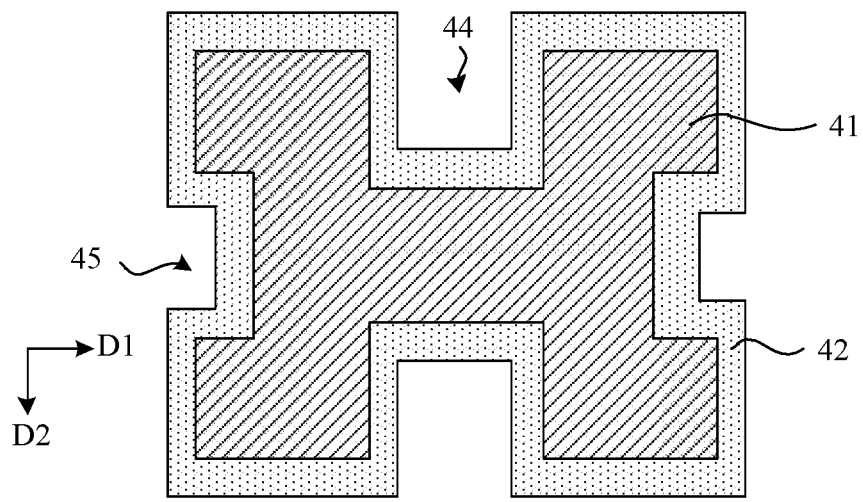

FIG. 11a and FIG. 11b are planar schematic diagrams of the two auxiliary electrodes according to an embodiment of the present disclosure, and are views observed in the A-A direction in FIG. 8. As shown in FIG. 11a, the shape of the auxiliary electrode 40 is an H-shape with grooves on the edge on two sides. On a plane parallel to the display substrate, the first auxiliary electrode 41 and the second auxiliary electrode 42 are both H-shaped. In an exemplary embodiment, two edges of the first auxiliary electrode 41 and the second auxiliary electrode 42 extending along a first direction D1 are each provided with a first groove 44 depressed towards the inside of the auxiliary electrode along a second direction D2. In an exemplary embodiment, the first direction D1 and the second direction D2 intersect with each other.

In an exemplary embodiment, the first auxiliary electrode 41 has a first length a in both the first direction D1 and the second direction D2. In the second direction D2, the first groove 44 has a first depth b, wherein the first depth b may be about ¼ to ½ of the first length a.

In an exemplary embodiment, the circumference of the rectangular first auxiliary electrode is 4a. The circumference of the H-shaped first auxiliary electrode is 4a+4b. In this way, the circumference of the H-shaped first auxiliary electrode is (1+b/a) times the circumference of the rectangular first auxiliary electrode, i.e., 5/4 to 3/2 times. For example, the first depth b may be about ⅓ of the first length a, then the circumference of the H-shaped first auxiliary electrode is 4/3 times of the circumference of the rectangular first auxiliary electrode, that is, the circumference increases by about 30%. In the exemplary embodiment of the present disclosure, the circumference of the auxiliary electrode is effectively increased by configuring the planar shape of the auxiliary electrode to be H-shaped, thereby effectively increasing the contact area between the auxiliary electrode and a cathode to be formed subsequently.

As shown in FIG. 11b, the shape of the auxiliary electrode 40 is an X-shape provided with grooves on edges of four sides. On a plane parallel to the display substrate, the first auxiliary electrode 41 and the second auxiliary electrode 42 are both X-shaped. In an exemplary embodiment, two edges of the first auxiliary electrode 41 and the second auxiliary electrode 42 extending along the first direction D1 are each provided with a first groove 44 depressed towards the inside of the auxiliary electrode along the second direction D2, and two edges of the first auxiliary electrode 41 and the second auxiliary electrode 42 extending along the second direction D2 are each provided with a second groove 45 depressed towards the inside of the auxiliary electrode along the first direction D1. In the exemplary embodiment of the present disclosure, the circumference of the auxiliary electrode may be further increased by configuring the planar shape of the auxiliary electrode to be X-shaped, thereby further increasing the contact area between the auxiliary electrode and the subsequently formed cathode.

In an exemplary embodiment, the first groove 44 and the second groove 45 may be in the shape of a triangle, a rectangle, a trapezoid, or a polygon, the edge of the triangle, rectangle, trapezoid, or polygon may be a straight line or a curved line, and a corner of the auxiliary electrode and a corner of a groove may be configured to be arc chamfers, which is not limited in the present disclosure.

Although description is made by taking the H-shape or X-shape as an example in FIG. 11a and FIG. 11b, while in an exemplary embodiment, the shape of the auxiliary electrode may be a polygon provided with a groove on an edge of one side or a polygon provided with grooves on the edges of three sides, and one or more grooves may be provided on the edge of each side of the auxiliary electrode, which is not limited in the present disclosure.

In an exemplary embodiment, a material of the third metal thin film may include any one or more of silver (Ag), copper (Cu), aluminum (Al), titanium (TI), and molybdenum (Mo), or an alloy material of the above metals, and a material of the second transparent conducting thin film may be indium tin oxide (ITO) or indium zinc oxide (IZO), etc.

Figure 12:
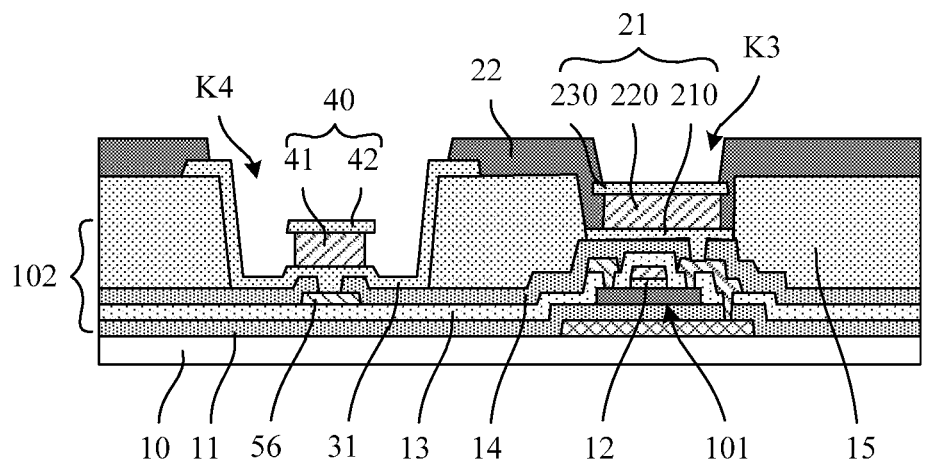
FIG. 12 is a schematic diagram in which a pattern of a pixel definition layer is formed according to an exemplary embodiment of the present disclosure.

(5) A pattern of a pixel definition layer is formed. In an exemplary embodiment, the formation of the pattern of the pixel definition layer may include: coating a pixel definition thin film on the base substrate on which the above patterns are formed, and patterning the pixel definition thin film by a patterning process to form the pattern of the pixel definition layer (PDL) 22. The pixel definition layer 22 is provided with a first pixel opening K3 and a second pixel opening K4, wherein the pixel definition layer 22 in the first pixel opening K3 is removed to expose part of a surface of the third anode layer 230 in the anode 21, and the pixel definition layer 22 in the second pixel opening K4 is removed to expose the auxiliary electrode via hole K2 and all of the surface of the second auxiliary electrode 42, as illustrated in FIG. 12. The first pixel opening exposing a part of the surface of the third anode layer 230 refers to that, for a first lower opening on a side in the first pixel opening adjacent to the base substrate, an orthographic projection of the first lower opening on the base substrate is within the range of the orthographic projection of the third anode layer 230 on the base substrate. The second pixel opening exposing all of the surface of the second auxiliary electrode 42 refers to that, for a second lower opening on a side in the second pixel opening adjacent to the base substrate, the orthographic projection of the second auxiliary electrode 42 on the base substrate is within the range of an orthographic projection of the second lower opening on the base substrate.

In an exemplary embodiment, the pixel definition layer may be made of polyimide, acrylic, polyethylene terephthalate, or the like. In a plane parallel to the display substrate, the first pixel opening K3 and the second pixel opening K4 may be in the shape of a triangle, a rectangle, a polygon, a circle, an ellipse, or the like. In a plane perpendicular to the display substrate, the sectional shapes of the first pixel opening K3 and the second pixel opening K4 may be a rectangle or a trapezoid.

(6) A pattern of an organic light emitting layer is formed.
In an exemplary embodiment, the pattern of the formation of the organic light emitting layer may include: evaporating an organic light emitting material on the base substrate on which the above patterns are formed to form patterns of an organic light emitting layer 23 and an organic light emitting block 32. The organic light emitting layer 23 is disposed in a region outside the second auxiliary electrode 42, the organic light emitting layer 23 is connected to the third anode layer 230 in the anode 21 through the first pixel opening K3, the organic light emitting block 32 is disposed on a surface of the second auxiliary electrode 42 away from the base substrate, and the organic light emitting block 32 is disposed to be isolated from the organic light emitting layer 23, as illustrated in FIG. 13*a*.

In an exemplary embodiment, due to the T-shaped structure of the auxiliary electrode, the second auxiliary electrode 42 protrudes from the first auxiliary electrode 41 for a certain distance, so the organic light emitting material is broken at a side edge of the second auxiliary electrode 42, the organic light emitting block 32 is formed on the second upper surface 421 of the second auxiliary electrode 42, and the organic light emitting layer 23 is formed in a region outside the second auxiliary electrode 42, thus achieving the isolation between the organic light emitting layer 23 and the organic light emitting block 32. In an exemplary embodiment, an orthographic projection of the organic light emitting block 32 on the base substrate may be approximately equal to the orthographic projection of the second auxiliary electrode 42 on the base substrate. The isolated and separated organic light emitting block is formed by separating the organic light emitting layer using the T-shaped auxiliary electrode, effectively avoiding the interference of the organic light emitting block on emitted light, thereby improving the quality of the emitted light and facilitating the improvement of the display quality.

In an exemplary embodiment, the organic light emitting layer 23 located in the region of the first pixel opening K3 is connected to the third anode layer 230, thus achieving the connection between the organic light emitting layer 23 and the anode 21. One portion of the organic light emitting layer 23 located in the region of the second pixel opening K4 covers a sidewall of the second pixel opening K4, and the other portion of the second pixel opening covers the bottom surface of the second pixel opening K4.

Figure 13A:
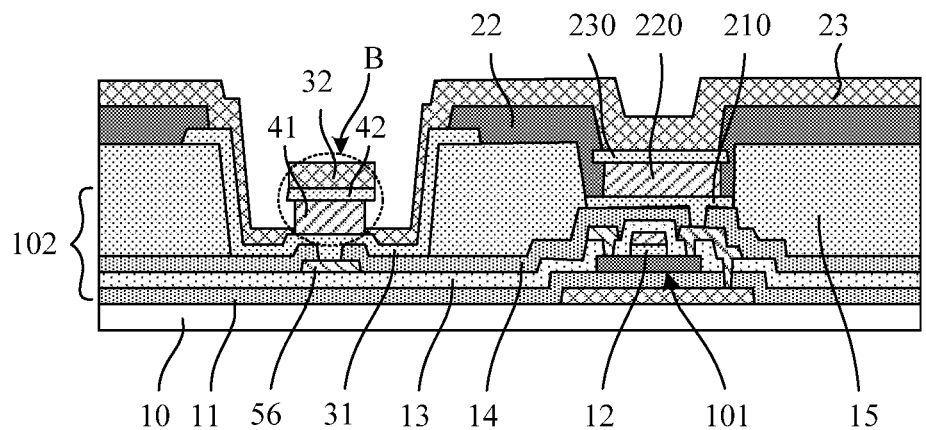
FIG. 13a and FIG. 13b are schematic diagrams in which a pattern of an organic light emitting layer is formed according to an exemplary embodiment of the present disclosure.
Figure 13B:
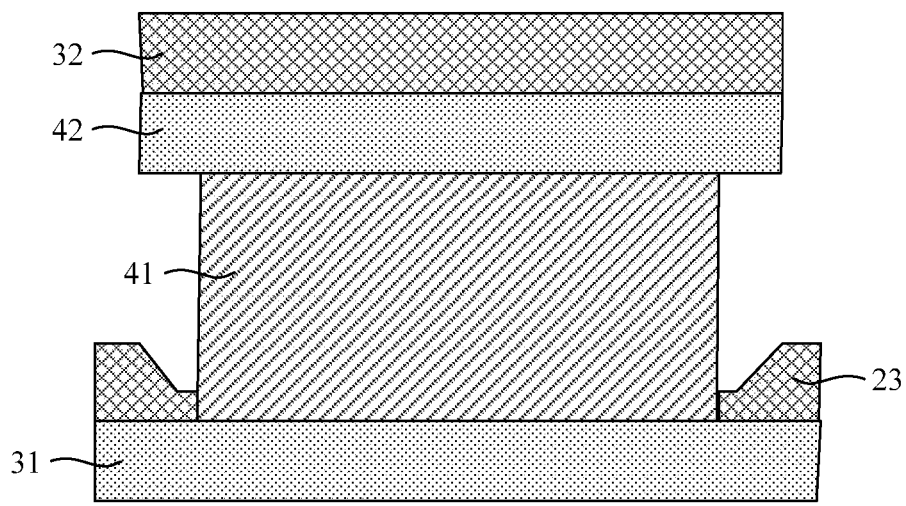

FIG. 13*b* is an enlarged view of region B in FIG. 13*a*. As shown FIG. 13*b*, in a process of evaporating the organic light emitting material, although the organic light emitting material may be evaporated in a region of the connection electrode 31 close to the first auxiliary electrode 41, due to the barrier of the second auxiliary electrode 42, the thickness of the evaporated organic light emitting material in this region is less than the thickness of the organic light emitting material at other positions. In an exemplary embodiment, the orthographic projection of the organic light emitting block 32 on the second auxiliary electrode 42 on the base substrate at least partially overlaps with an orthographic projection of the organic light emitting layer 23 on the base substrate, and an overlap region may be an edge region of the organic light emitting layer 23 close to the first auxiliary electrode 41. In an exemplary embodiment, the thickness of the organic light emitting material in the edge region of the organic light emitting layer 23 close to the first auxiliary electrode 41 may be less than the thickness of the organic light emitting material in other regions of the organic light emitting layer 23, and may be less than the thickness of the organic light emitting block 32.

In an exemplary embodiment, the organic light emitting layer may include an emitting layer (EML) and any one or more of the following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary embodiment, the organic light emitting layer may be formed by evaporation using a Fine Metal Mask (FMM) or an open mask, or by an ink jet process.

In an exemplary embodiment, the organic light emitting layer may be formed by the following method. First, an open mask is used for evaporation to sequentially form a hole injection layer and a hole transport layer, and a common layer of the hole injection layer and the hole transport layer is formed on the display substrate. Then, a fine metal mask is used for evaporation to form an electron block layer and a red light emitting layer in a red sub-pixel, an electron block layer and a green light emitting layer in a green sub-pixel, and an electron block layer and a blue light emitting layer in a blue sub-pixel. The electron block layers and the light emitting layers of adjacent sub-pixels may overlap slightly (for example, an overlap portion accounts for less than 10% of the area of a pattern of the respective light emitting layer), or may be isolated from one another. Then, an open mask is used for evaporation to sequentially form a hole block layer, an electron transport layer, and an electron injection layer, and a common layer of the hole block layer, the electron transport layer, and the electron injection layer is formed on the display substrate.

In an exemplary embodiment, the electron block layer may be used as a micro-cavity regulating layer of a light emitting device. By designing the thickness of the electron block layer, the thickness of the organic light emitting layer between the cathode and the anode can satisfy the design for the length of a micro-cavity. In some exemplary embodiments, the hole transport layer, the hole block layer, or the electron transport layer in the organic light emitting layer may be used as the micro-cavity regulating layer of the light emitting device, which is not limited in the present disclosure.

In an exemplary embodiment, the light emitting layer may include a host material and a dopant material doped in the host material, wherein a doping ratio of the dopant material in the light emitting layer is 1% to 20%. In this range of doping ratio, on the one hand, the host material of the light emitting layer can effectively transfer exciton energy to the dopant material of the light emitting layer to excite the dopant material of the light emitting layer to emit light; on the other hand, the host material of the light emitting layer "dilutes" the dopant material of the light emitting layer, thus effectively alleviating the fluorescence quenching caused by intermolecular collision and energy collision of the dopant material of the light emitting layer, and improving the luminous efficiency and service life of the device. In an exemplary embodiment, the doping ratio refers to a ratio of mass of the dopant material to mass of the light emitting layer, i.e., a mass percentage. In an exemplary embodiment, the host material and the dopant material may be evaporated together by a multi-source evaporation process, so that the host material and the dopant material are uniformly dispersed in the light emitting layer. The doping ratio can be adjusted by controlling the evaporation rate of the dopant material in the evaporation process, or the doping ratio can be adjusted by controlling a ratio between the evaporation rates of the host material and the dopant material. In an exemplary embodiment, the thickness of the light emitting layer may be about 10 nm to 50 nm.

In an exemplary embodiment, the hole injection layer may be made of an inorganic oxide, such as a molybdenum oxide, a titanium oxide, a vanadium oxide, a rhenium oxide, a ruthenium oxide, a chromium oxide, a zirconium oxide, a hafnium oxide, a tantalum oxide, a silver oxide, a tungsten oxide, or a manganese oxide, or may be made of a p-type dopant in a strong electron acceptor system or a dopant of a hole transport material. In an exemplary embodiment, the thickness of the hole injection layer may be about 5 nm to 20 nm.

In an exemplary embodiment, the hole transport layer may be made of a material with relatively high hole mobility, such as an aromatic amine compound, a substituent group of which may be carbazole, methylfluorene, spirofluorene, dibenzothiophene, furan, or the like. In an exemplary embodiment, the thickness of the hole transport layer may be about 40 nm to 150 nm.

In an exemplary embodiment, the hole block layer and the electron transport layer may be made of aromatic heterocyclic compounds, for example, imidazole derivatives such as a benzimidazole derivative, an imidazolopyridine derivative, or a benzimidazolophenanthridine derivative; azine derivatives such as a pyrimidine derivative or a triazine derivative; and compounds containing a nitrogen-containing six-membered ring structure (also including compounds with phosphine oxide substituents on heterocycles), such as a quinoline derivative, an isoquinoline derivative, or a phenanthroline derivative, etc. In an exemplary embodiment, the thickness of the hole block layer may be about 5 nm to 15 nm, and the thickness of the electron transport layer may be about 20 nm to 50 nm.

In an exemplary embodiment, the electron injection layer may be made of an alkali metal or a metal, such as lithium fluoride (LiF), ytterbium (Yb), magnesium (Mg), or calcium (Ca), or a compound of these alkali metals or metals. In an exemplary embodiment, the thickness of the electron injection layer may be about 0.5 nm to 2 nm.

(7) A pattern of a cathode is formed. In an exemplary embodiment, the formation of the pattern of the cathode may include: evaporating a cathode material on the base substrate on which the above patterns are formed to form the pattern of the cathode 24. The cathode 24 is connected to the organic light emitting layer 23, and is in large-area contact connection with the auxiliary electrode 40 by wrapping the organic light emitting block 32 and the auxiliary electrode 40, as illustrated in FIG. 5.

In an exemplary embodiment, the cathode 24 may be an integral structure. In a region outside the auxiliary electrode 40, the cathode 24 is disposed on the organic light emitting layer 23. In a region where the auxiliary electrode 40 is located, the cathode 24 is disposed on an exposed surface of the organic light emitting block 32 on the one hand, and on an exposed surface of the auxiliary electrode 40 on the other hand, thus forming a structure wrapping the auxiliary electrode 40 and the organic light emitting block 32.

Referring to FIG. 5 and FIG. 9, for the organic light emitting block 32, one portion of the cathode 24 covers a surface the organic light emitting block 32 away from the base substrate, and the other portion of the cathode 24 covers a side surface of the organic light emitting block 32. For the second auxiliary electrode 42, the organic light emitting block 32 covers a surface of the second auxiliary electrode 42 away from the base substrate, one portion of the cathode 24 covers the second side surface 422 of the second auxiliary electrode 42, and the other portion of the cathode 24 covers the second lower surface 423 on the lower side of the second auxiliary electrode 42, that is, the cathode 24 covers the lower surface of the portion of the second auxiliary electrode 42 which protrudes from the first auxiliary electrode 41, and an orthographic projection of the cathode 24 on the side (upper surface) of the second auxiliary electrode 42 away from the base substrate and an orthographic projection of the cathode 24 on the side (lower surface) of the second auxiliary electrode 42 adjacent to the base substrate on the substrate at least partially overlap. In this way, the connection between the cathode 24 and the second auxiliary electrode 42 and the wrapping of the organic light emitting block 32 are both implemented. Since the cathode 24 and the second auxiliary electrode 42 are connected by the second side surface 422 and the second lower surface 423, a potential of the cathode 24 on the upper side of the organic light emitting block 32 is equal to that of the second auxiliary electrode 42 on the lower side of the organic light emitting block 32, that is, the potentials on two sides of the organic light emitting block 32 are equal, thereby ensuring that the organic light emitting block 32 does not emit light, thus avoiding the flicker phenomenon caused by light emission of the organic light emitting block 32. Since the contact area between the cathode 24 and the first side surface 411 is directly proportional to the circumference of the first auxiliary electrode 41, if the circumference first auxiliary electrode 41 is longer, the contact area between the cathode 24 and the first auxiliary electrode 41 is increased. In the exemplary embodiment of the present disclosure, the circumference of the auxiliary electrode is effectively increased by designing the shape of the auxiliary electrode (in the plane parallel to the display substrate) to be a polygon provided with a groove on the edge, such as an H-shape or an X-shape, effectively increasing the contact area between the cathode and the auxiliary electrode, thereby effectively reducing the resistance at a contact interface and improving the display effect.

So far, the pattern of the light emitting structure layer 103 is formed on the drive circuit layer 102. The light emitting structure layer 103 includes the anode, the connection electrode, the pixel definition layer, the organic light emitting layer, the cathode, and the auxiliary electrode. The organic light emitting layer is respectively connected to the anode and the cathode, the cathode is connected to the auxiliary electrode, and the auxiliary electrode is connected to the connection electrode.

In an exemplary embodiment, the process of manufacturing the display substrate may include forming a pattern of an encapsulation layer. The formation of the pattern of the encapsulation layer may include: first depositing a first inorganic thin film by Plasma Enhanced Chemical Vapor Deposition (PECVD) using an open mask, to form a first encapsulation layer; then inkjet-printing an organic material on the first encapsulation layer by an ink-jet printing process, to form a second encapsulation layer after curing for film formation; and finally depositing a second inorganic thin film by using an open mask, to form a third encapsulation layer, wherein the first encapsulation layer, the second encapsulation layer, and the third encapsulation layer form an encapsulation layer. In an exemplary embodiment, the first encapsulation layer and the third encapsulation layer may be made of any one or more of silicon oxide (SiOx), silicon nitride (SiNx), and silicon nitride (SiON), and each may be in a single-layer structure, a multi-layer structure, or a composite layer structure; the second encapsulation layer may be made of a resin material, thereby forming a stacked structure of inorganic material/organic material/inorganic material, wherein the organic material layer is disposed between the two inorganic material layers, thus ensuring that the external water vapor cannot enter the light emitting structure layer.

In an exemplary embodiment, after the encapsulation layer is formed, a touch structure layer (TSP) may be formed on the encapsulation layer, and the touch structure layer may include a touch electrode layer, or include a touch electrode layer and a touch insulating layer.

In an exemplary embodiment, during the manufacturing of a flexible display substrate, the process of manufacturing the display substrate may include processes such as peeling-off of a glass carrier plate, attaching of a back film, and cutting, which is not limited in the present disclosure.

From the structure and the manufacturing process of the display substrate according to the exemplary embodiment of the present disclosure, it can be seen that, according to the exemplary embodiment of the present disclosure, in the plane parallel to the display substrate, the circumference of the auxiliary electrode is effectively increased by configuring the planar shape of the auxiliary electrode to be a polygon provided with a groove on the edge, such as an H-shape or an X-shape; and the contact area between the cathode and the auxiliary electrode is effectively increased by configuring the cathode to be in contact connection to the side surface of the auxiliary electrode, effectively reducing the resistance at the contact interface, and thereby improving the display effect. According to the exemplary embodiment of the present disclosure, in the plane perpendicular to the display substrate, the organic light emitting layer is separated at the edge of the auxiliary electrode by configuring the sectional shape of the auxiliary electrode to be T-shaped, so that the organic light emitting block above the auxiliary electrode is isolated, avoiding the interference of the organic light emitting block on the emitted light, and thereby improving the quality of the emitted light and facilitating the improvement of the display quality. According to the exemplary embodiment of the present disclosure, in the plane perpendicular to the display substrate, by configuring the second auxiliary electrode in the auxiliary electrode to protrude from the first auxiliary electrode and the cathode to be connected to the second auxiliary electrode, it is realized that the two sides of the organic light emitting block have the same potential, ensuring that the organic light emitting block does not emit light and thus avoiding the flicker phenomenon caused by light emission of the organic light emitting block. Since the method for manufacturing the display substrate according to the exemplary embodiment of the present disclosure does not adopt a laser hole forming process, not only the tact time is shortened, but also no particles are produced in the manufacturing process, thus improving the production efficiency and product yield. The method for manufacturing the display substrate according to the exemplary embodiment of the present disclosure has advantages of good process compatibility, simple process implementation, easy operation, high production efficiency, low production cost, and high yield.

Figure 14:
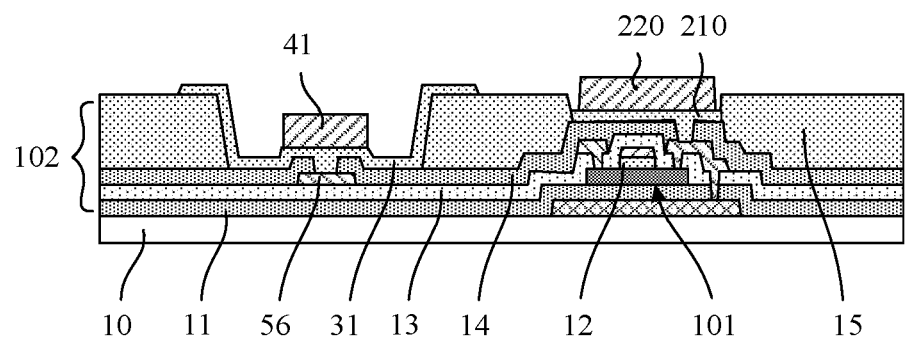
FIG. 14 and FIG. 15 are schematic diagrams in which another pattern of an anode and an auxiliary electrode is formed according to an exemplary embodiment of the present disclosure.
Figure 15:
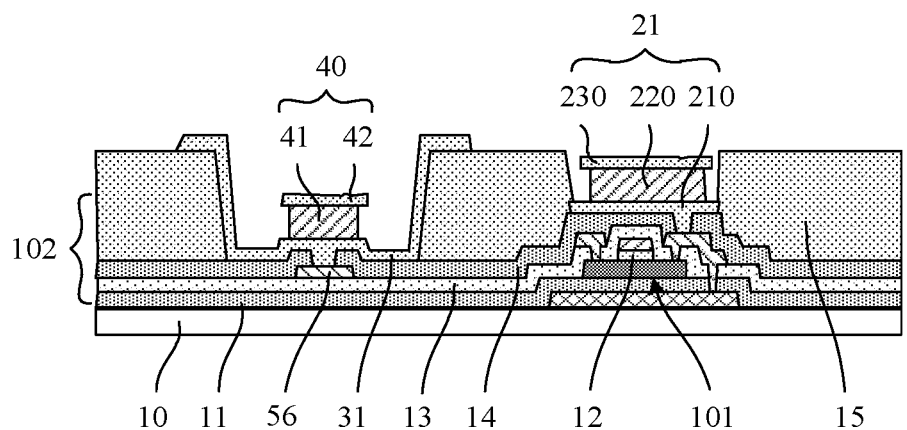

FIG. 14 to FIG. 15 illustrate another process for manufacturing a display substrate according to an exemplary embodiment of the present disclosure. In an exemplary embodiment, another process for manufacturing the display substrate may include the following operations.

(11) The processes for manufacturing a base substrate and a drive circuit layer are the same as those for manufacturing the base substrate and the drive circuit layer in the above embodiment.

(12) Patterns of a first conducting layer and a second conducting layer are formed. In an exemplary embodiment, the formation of the patterns of the first conducting layer and the second conducting layer may include: sequentially depositing a first transparent conducting thin film and a third metal thin film on the base substrate on which the above pattern is formed, and patterning the first transparent conducting thin film and the third metal thin film by a patterning process to form the patterns of the first conducting layer and the second conducting layer. In an exemplary embodiment, the pattern of the first conducting layer at least includes a first anode layer 210 and a connection electrode 31. The first anode layer 210 is disposed on a fourth insulating layer 14 in an anode via hole and is connected to a drain electrode of a transistor 101 through a first via hole. The connection electrode 31 is disposed on the fourth insulating layer 14 in an auxiliary electrode via hole and is connected to a power supply electrode 56 through a second via hole. The pattern of the second conducting layer at least includes a second anode layer 220 and a first auxiliary electrode 41. The second anode layer 220 is disposed in the anode via hole K1 on a side of the first anode layer 210 away from the base substrate and is connected to the first anode layer 210, and the first auxiliary electrode 41 is disposed in the auxiliary electrode via hole K2 on a side of the connection electrode 31 away from the base substrate and is connected to the connection electrode 31, as illustrated in FIG. 14.

In an exemplary embodiment, the first transparent conducting thin film and the third metal thin film may be patterned by a patterning process using a half-tone or gray-tone mask. For example, the patterning may include: coating a layer of positive photoresist on the third metal thin film, and exposing the photoresist by using the half-tone or gray-tone mask, so that the photoresist forms a fully exposed region, a partially exposed region, and an unexposed region; then performing development, wherein the photoresist in the unexposed region is remained such that the remained photoresist has a first thickness, a portion of the thickness of the photoresist in the partially exposed region is removed such that the remained photoresist has a second thickness, the second thickness is less than the first thickness, and the photoresist in the fully exposed region is completely removed to expose a surface of the third metal thin film; then performing a first etching treatment to etch off the first transparent conducting thin film and the third metal thin film in the fully exposed region, to form patterns of the first anode layer 210 and the connection electrode 31; performing ashing treatment to remove the photoresist with the second thickness in the partially exposed region, to expose the surface of the third metal thin film; and finally performing second etching treatment to etch away the third metal thin film in the partially exposed region, to form patterns of the second anode layer 220 and the first auxiliary electrode 41.

(13) Patterns of an anode and an auxiliary electrode are formed. In an exemplary embodiment, the formation of the patterns of the anode and the auxiliary electrode may include: depositing a second transparent conducting thin film on the base substrate on which the above patterns are formed, and patterning the second transparent conducting thin film by a patterning process to form patterns of a third anode layer 230 and a second auxiliary electrode 42, wherein the third anode layer 230 is disposed on a side of the second anode layer 220 away from the base substrate and is connected to the second anode layer 220, and the second auxiliary electrode 42 is disposed on a side of the first auxiliary electrode 41 away from the base substrate and is connected to the first auxiliary electrode 41. The stacked first anode layer 210, second anode layer 220, and third anode layer 230 form an anode 21, and the stacked first auxiliary electrode 41 and second auxiliary electrode 42 form an auxiliary electrode 40, as illustrated in FIG. 15.

In an exemplary embodiment, in the process of patterning the second transparent conducting thin film, a first etchant and a second etchant may be used separately for etching, and a T-shape of the auxiliary electrode and an I-shape of the anode may be formed by drilling. In an exemplary embodiment, the first etchant may be an etchant (ITO etchant) for etching a transparent conducting material, and the second etchant may be an etchant (metal etchant) for etching a metal material. In an exemplary embodiment, an etching process may include: first etching the second transparent conducting thin film by using the ITO etchant, to form patterns of the third anode layer 230 and the second auxiliary electrode 42; and then continuing the etching by using the metal etchant. Since rates of etching the second anode layer 220 and the first auxiliary electrode 41 by using the metal etchant are greater than rates of etching the third anode layer 230 and the second auxiliary electrode 42, side surfaces of the second anode layer 220 and the first auxiliary electrode 41 are etched to form recesses. The first anode layer 210 below the second anode layer 220 and the third anode layer 230 above the second anode layer 220 both protrude from the second anode layer 220 for a certain distance to form an I-shaped structure. The second auxiliary electrode 42 above the first auxiliary electrode 41 protrudes from the first auxiliary electrode 41 for a certain distance to form a T-shaped structure.

(14) The processes such as forming a pixel definition layer, an organic light emitting layer, and a cathode are the same as those in the above embodiment, which are not repetitively described herein.

Referring to FIG. 5 to FIG. 15, the display substrate formed by the above manufacturing process may include:
a base substrate 10;
a barrier layer 51 disposed on the base substrate 10;
a first insulating layer 11 covering the barrier layer 51;
an active layer 52 disposed on the first insulating layer 11;
a second insulating layer 12 covering the active layer 52;
a gate electrode 53 disposed on the second insulating layer 12;
a third insulating layer 13 covering the gate electrode 53 and provided with an active via hole exposing the active layer 52 and a barrier via hole exposing the barrier layer 51
a source electrode 54, a drain electrode 55, and a power supply electrode 56 which are disposed on the third insulating layer 13, wherein the source electrode 54 and the drain electrode 55 are respectively connected to the active layer 52 through the active via hole, and the drain electrode 55 is connected to the barrier layer 51 through the barrier via hole;
a fourth insulating layer 14 covering the source electrode 54, the drain electrode 55, and the power supply electrode 56 and provided with a first via hole exposing the drain electrode 55 and a second via hole exposing the power supply electrode 56;
a planarization layer 15 disposed on the fourth insulating layer 14 and provided with an anode via hole exposing the first via hole and an auxiliary electrode via hole exposing the second via hole;
an anode 21 disposed in the anode via hole, the anode 21 including a first anode layer 210, a second anode layer 220, and a third anode layer 230 which are stacked and form an I-shaped structure, wherein the first anode layer 210 is connected to the drain electrode 55 through the first via hole;
a connection electrode 31 and an auxiliary electrode 40 which are disposed in the auxiliary electrode via hole, wherein the connection electrode 31 is connected to the power supply electrode 56 through the second via hole, the auxiliary electrode 40 includes a first auxiliary electrode 41 and a second auxiliary electrode 42 which are stacked and form a T-shaped structure, and the first auxiliary electrode 41 is connected to the connection electrode 31;
a pixel definition layer 22 disposed on the planarization layer 15 and provided with a first pixel opening and a second pixel opening, wherein the first pixel opening exposes part of a surface of the third anode layer 230, and the second pixel opening exposes all of a surface of the second auxiliary electrode 42;
an organic light emitting layer 23 disposed on the pixel definition layer 22 and an organic light emitting block 32 disposed on the second auxiliary electrode 42, wherein the organic light emitting layer 23 is connected to the third anode layer 230 through the first pixel opening, and the organic light emitting block 32 is disposed to be isolated from the organic light emitting layer 23;
a cathode 24 disposed on the organic light emitting layer 23, wherein the cathode 24 is connected to the organic light emitting layer 23, and is in large-area contact connection with the auxiliary electrode 40 by wrapping the organic light emitting block 32 and the auxiliary electrode 40; and an encapsulation layer disposed on the cathode 24 and including a first encapsulation layer, a second encapsulation layer, and a third encapsulation layer which are stacked.

The structure and the manufacturing process in the exemplary embodiment of the present disclosure are only exemplary. In an exemplary embodiment, the corresponding structures may be changed and the patterning processes may be increased or decreased according to actual needs. For example, the transistor in the drive circuit layer may have a top-gate structure, a bottom-gate structure, a single-gate structure, or a double-gate structure. For another example, the drive circuit layer and the light emitting structure layer may also be provided therein with other film layer structures, electrode structures, or lead structures. For another example, the base substrate may be a glass substrate, which is not specifically limited in the present disclosure.

Figure 16:
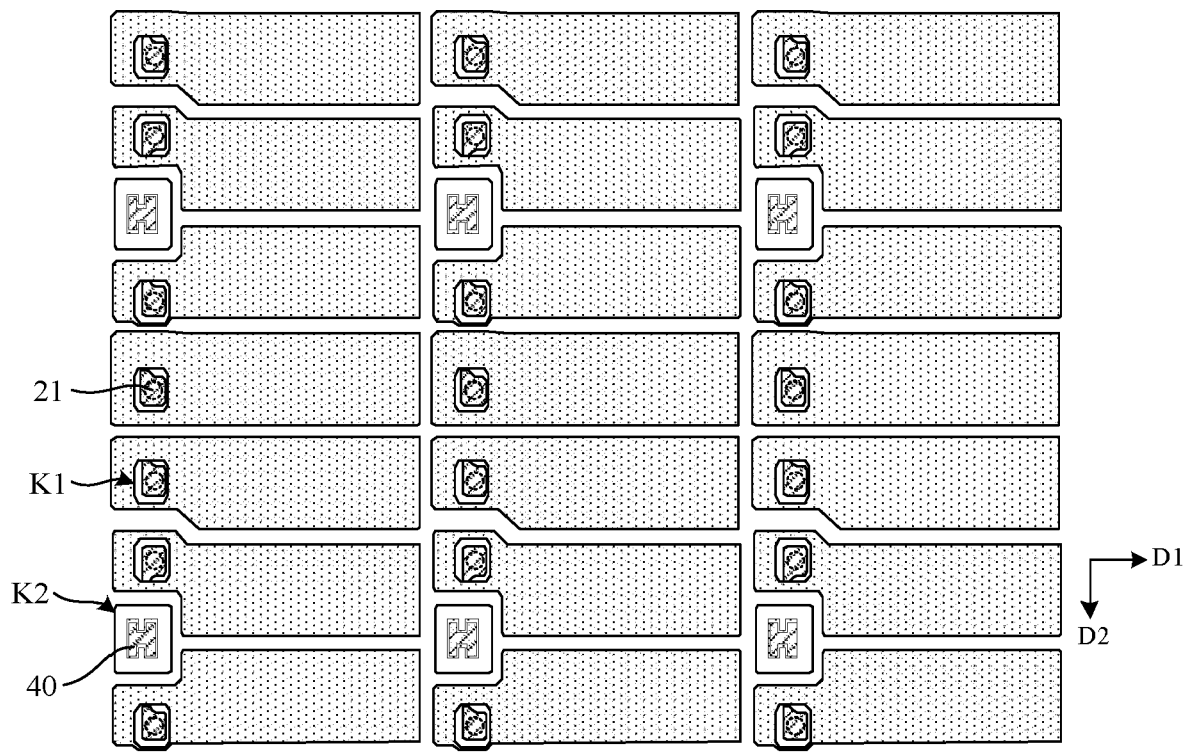
FIG. 16 is a schematic diagram of an arrangement of auxiliary electrodes according to an exemplary embodiment of the present disclosure.

FIG. 16 is a schematic diagram of an arrangement of an auxiliary electrode according to an exemplary embodiment of the present disclosure. In an exemplary embodiment, the display substrate may include multiple sub-pixels, wherein the multiple sub-pixels are disposed in an array respectively along the first direction D1 and the second direction D2. Each sub-pixel is provided therein with an anode via hole K1, an anode 21 is disposed in the anode via hole K1, auxiliary electrode via holes K2 are disposed between some sub-pixels, and auxiliary electrodes 40 are disposed in the auxiliary electrode via holes K2. In this way, multiple sub pixels may share one auxiliary electrode 40.

In an exemplary embodiment, the auxiliary electrode via hole K2 is disposed between the anode via holes K1 of adjacent sub-pixels in the second direction D2.

In an exemplary embodiment, in the first direction D1, the auxiliary electrode via holes K2 may be disposed sequentially, the auxiliary electrode via holes K2 are arranged in accordance with the arrangement of the sub-pixels, and two adjacent auxiliary electrode via holes K2 are spaced from each other by only one sub-pixel. In the second direction D2, the auxiliary electrode via holes K2 may be disposed at intervals, that is, multiple sub-pixels are disposed between two adjacent auxiliary electrode via holes K2. In an exemplary embodiment, in the second direction D2, at least two sub-pixels are disposed between two adjacent auxiliary electrode via holes K2. Therefore, multiple auxiliary electrode via hole rows arranged along the first direction D1 and multiple auxiliary electrode via hole columns arranged along the second direction D2 are formed by the auxiliary electrode via holes K2, wherein the number of the auxiliary electrode via hole columns is greater than the number of the auxiliary electrode via hole rows, that is, the number of queues of the auxiliary electrode via holes K2 arranged along the second direction D2 is greater than the number of queues of the auxiliary electrode via holes K2 arranged along the first direction D1.

In an exemplary embodiment, an auxiliary electrode via hole K2 may be in the shape of a rectangle, and the length of the auxiliary electrode via hole K2 extending along the second direction D2 may be greater than the length of the auxiliary electrode via hole K2 extending along the first direction D1.

The present disclosure further provides a method for manufacturing a display substrate. In an exemplary embodiment, the method may include:

a drive circuit layer is formed on a base substrate; and a light emitting structure layer is formed on the drive circuit layer, wherein the light emitting structure layer includes an anode, an organic light emitting layer, a cathode, and an auxiliary electrode, the organic light emitting layer is respectively connected to the anode and the cathode, and the cathode is connected to the auxiliary electrode; in a plane parallel to the display substrate, an edge of the auxiliary electrode is provided with a structure depressed towards the center of the auxiliary electrode.

In an exemplary embodiment, the formation of the drive circuit layer on the base substrate may include:

a transistor and a power supply electrode are formed on the base substrate;

a passivation layer covering the transistor and the power supply electrode is formed, wherein the passivation layer is provided with a first via hole and a second via hole, the first via hole exposes a drain electrode of the transistor, and the second via hole exposes the power supply electrode; and a planarization layer covering passivation layer is formed, wherein the planarization layer is provided with an anode via hole and an auxiliary electrode via hole, the anode via hole exposes the first via hole, and the auxiliary electrode via hole exposes the second via hole.

In an exemplary embodiment, the formation of the light emitting structure layer on the drive circuit layer may include:

a connection electrode, an anode, and an auxiliary electrode are formed, wherein the anode includes a first anode layer, a second anode layer, and a third anode layer which are stacked, and the auxiliary electrode includes a first auxiliary electrode and a second auxiliary electrode which are stacked;

a pixel definition layer is formed, wherein the pixel definition layer is provided thereon with a first pixel opening and a second pixel opening, the first pixel opening exposes part of a surface of the third anode layer, and the second pixel opening exposes all of a surface of the auxiliary electrode;

an organic light emitting layer and an organic light emitting block are formed, wherein the organic light emitting layer is connected to the third anode through the first pixel opening, the organic light emitting block is disposed on the second auxiliary electrode, and the organic light emitting block is disposed to be isolated from the organic light emitting layer; and a cathode is formed, wherein the cathode is connected to the organic light emitting layer, and is in contact connection with the auxiliary electrode by wrapping the organic light emitting block and the auxiliary electrode.

In an exemplary embodiment, the formation of the connection electrode, the anode, and the auxiliary electrode may include:

a first anode layer and the connection electrode are formed, wherein the first anode layer is disposed in the anode via hole, the first anode layer is connected to the drain electrode of the transistor through the first via hole, at least a portion of the connection electrode is disposed in the auxiliary electrode via hole, and the connection electrode is connected to the power supply electrode through the second via hole;

a second anode layer, a third anode layer, a first auxiliary electrode, and a second auxiliary electrode are formed, wherein the second anode layer is disposed on the first anode layer, the third anode layer is disposed on the second anode layer, the first auxiliary electrode is disposed on the connection electrode in the auxiliary electrode via hole, and the second auxiliary electrode is disposed on the first auxiliary electrode.

In an exemplary embodiment, the formation of the connection electrode, the anode, and the auxiliary electrode may include:

a first anode layer, a second anode layer, the connection electrode, and a first auxiliary electrode are formed, wherein the first anode layer is disposed in the anode via hole, the first anode layer is connected to the drain electrode of the transistor through the first via hole, the second anode layer is disposed on the first anode layer, at least a portion of the connection electrode is disposed in the auxiliary electrode via hole, the connection electrode is connected to the power supply electrode through the second via hole, and the first auxiliary electrode is disposed on the connection electrode in the auxiliary electrode via hole; and a third anode layer and a second auxiliary electrode are formed, wherein the third anode layer is disposed on the second anode layer, and the second auxiliary electrode is disposed on the first auxiliary electrode.

In an exemplary embodiment, an orthographic projection of the first auxiliary electrode on the base substrate is within the range of an orthographic projection of the second auxiliary electrode on the base substrate, and the stacked first auxiliary electrode and second auxiliary electrode form a T-shaped structure. An orthographic projection of the first anode layer on the base substrate is within the range of an orthographic projection of the anode via hole on the base substrate, an orthographic projection of the second anode layer on the base substrate is within the range of orthographic projections of the first anode layer and the third anode layer on the base substrate, and the stacked first anode layer, second anode layer and third anode layer form an I-shape.

In an exemplary embodiment, the contact connection with the auxiliary electrode implemented by wrapping the organic light emitting block and the auxiliary electrode includes:

For the stacked first auxiliary electrode, second auxiliary electrode, and organic light emitting block, the cathode covers a surface of the organic light emitting block away from the base substrate and covers a side surface of the organic light emitting block; the cathode covers a side surface of the second auxiliary electrode and a surface on a side, adjacent to the base substrate, of a portion of the second auxiliary electrode which protrudes from the first auxiliary electrode.

The present disclosure provides a method for manufacturing a display substrate, wherein the circumference of the auxiliary electrode is effectively increased by configuring the planar shape of the auxiliary electrode to be a polygon provided with a groove on an edge; and the contact area between the cathode and the auxiliary electrode is effectively increased by configuring the cathode to be in contact connection with the side surface of the auxiliary electrode, effectively reducing the resistance at the contact interface, and thereby improving the display effect. The organic light emitting layer is separated at the edge of the auxiliary electrode by configuring the sectional shape of the auxiliary electrode to be T-shaped, so that the organic light emitting block above the auxiliary electrode is isolated, avoiding the interference of the organic light emitting block on the emitted light, and thereby improving the quality of the emitted light and facilitating the improvement of the display quality. By configuring the second auxiliary electrode in the auxiliary electrode to protrude from the first auxiliary electrode and the cathode to be connected to the second auxiliary electrode, it is realized that the two sides of the organic light emitting block have the same potential, ensuring that the organic light emitting block does not emit light and thus avoiding the flicker phenomenon caused by light emission of the organic light emitting block. Since the manufacturing method in the exemplary embodiment of the present disclosure does not adopt a laser hole forming process, not only the tact time is shortened, but also no particles are produced in the manufacturing process, thus improving the production efficiency and product yield. The method for manufacturing the display substrate in the exemplary embodiment of the present disclosure has the advantages of good process compatibility, simple process implementation, easy operation, high production efficiency, low production cost, and high yield.

The present disclosure further provides a display device, including the display substrate in the above embodiment. The display device may be any product or component with a display function, such as a mobile phone, a tablet computer, a television, a display, a laptop computer, a digital photo frame, or a navigator.

Although the embodiments disclosed in the present disclosure are described as above, the contents described are merely embodiments used to facilitate understanding of the present disclosure and are not used to limit the present disclosure. Those skilled in the art may make any modification and change to the implementation form and details without departing from the essence and scope of the present disclosure. However, the scope of patent protection of the present disclosure should still be subject to the scope defined by the appended claims.

What is claimed is:

1. A display substrate, comprising a drive circuit layer disposed on a base substrate and a light emitting structure layer disposed on a side of the drive circuit layer away from the base substrate, wherein the light emitting structure layer comprises an anode, an organic light emitting layer, a cathode, and an auxiliary electrode, the organic light emitting layer is respectively connected to the anode and the cathode, and the cathode is connected to the auxiliary electrode; in a plane perpendicular to the display substrate, the auxiliary electrode comprises a first auxiliary electrode and a second auxiliary electrode disposed on a side of the first auxiliary electrode away from the base substrate; in a plane parallel to the display substrate, a shape of the first auxiliary electrode and the second auxiliary electrode comprises a polygon provided with a groove; two edges of the first auxiliary electrode and the second auxiliary electrode extending along a first direction are each provided with a first groove depressed towards an inside of the auxiliary electrode along a second direction, and the first direction and the second direction intersect with each other; wherein that the cathode is connected to the auxiliary electrode comprises: the cathode covers a side surface of the second auxiliary electrode and a surface of a side, adjacent to the base substrate, of a portion of the second auxiliary electrode which protrudes from the first auxiliary electrode.

2. The display substrate according to claim 1, wherein the polygon provided with the groove comprises an H-shape or an X-shape.

3. The display substrate according to claim 1, wherein the first auxiliary electrode and the second auxiliary electrode which are stacked form a T-shaped structure.

4. The display substrate according to claim 3, wherein the light emitting structure layer further comprises an organic light emitting block, the organic light emitting block is disposed on a side of the second auxiliary electrode away from the base substrate, and an orthographic projection of the organic light emitting block on the base substrate is within the range of an orthographic projection of the second auxiliary electrode in the auxiliary electrode on the base substrate; the organic light emitting block and the organic light emitting layer are disposed in a same layer and are made of a same material, and the organic light emitting block is disposed to be isolated from the organic light emitting layer.

5. The display substrate according to claim 4, wherein the orthographic projection of the organic light emitting block on the base substrate and an orthographic projection of the organic light emitting layer on the base substrate at least partially overlap with each other.

6. The display substrate according to claim 4, wherein a thickness of an edge of the organic light emitting layer close to the organic light emitting block is less than a thickness of the organic light emitting block.

7. The display substrate according to claim 4, wherein the cathode is in contact connection with the auxiliary electrode by wrapping the organic light emitting block and the auxiliary electrode.

8. The display substrate according to claim 4, wherein for the first auxiliary electrode, the second auxiliary electrode, and the organic light emitting block which are stacked, the cathode covers a surface of the organic light emitting block away from the base substrate and covers a side surface of the organic light emitting block; and
- an orthographic projection of a cathode of the second auxiliary electrode on the side away from the base substrate and an orthographic projection of a cathode of the second auxiliary electrode on the side adjacent to the base substrate on the base substrate at least partially overlap with each other.

9. The display substrate according to claim 1, wherein the anode comprises a first anode layer, a second anode layer disposed on a side of the first anode layer away from the base substrate, and a third anode layer disposed on a side of the second anode layer away from the base substrate; the first anode layer, the second anode layer, and the third anode layer which are stacked form an I-shape; the second anode layer and a first auxiliary electrode in the auxiliary electrode are disposed in a same layer and are made of a same material; the third anode layer and a second auxiliary electrode in the auxiliary electrode are disposed in a same layer and are made of a same material.

10. The display substrate according to claim 1, wherein on the plane perpendicular to the display substrate, the drive circuit layer comprises: a transistor and a power supply electrode disposed on the base substrate, the power supply electrode and a drain electrode of the transistor being disposed in a same layer; a passivation layer covering the transistor and the power supply electrode, the passivation layer being provided with a first via hole and a second via hole, with the first via hole exposing the drain electrode of the transistor, and the second via hole exposing the power supply electrode; a planarization layer disposed on the passivation layer, the planarization layer being provided with an anode via hole and an auxiliary electrode via hole, with the anode via hole exposing the first via hole, and the auxiliary electrode via hole exposing the second via hole.

11. The display substrate according to claim 10, wherein an orthographic projection of the anode on the base substrate is within the range of an orthographic projection of the anode via hole on the base substrate; a first anode layer in the anode is connected to the drain electrode of the transistor through the first via hole; an orthographic projection of the auxiliary electrode on the base substrate is within the range of an orthographic projection of the auxiliary electrode via hole on the base substrate.

12. The display substrate according to claim 10, wherein the light emitting structure layer further comprises a connection electrode, the connection electrode is connected to the power supply electrode through the second via hole in the auxiliary electrode via hole, and the first auxiliary electrode in the auxiliary electrode is disposed on a side of the connection electrode away from the base substrate; and the connection electrode and the first anode layer in the anode are disposed in a same layer and are made of a same material.

13. The display substrate according to claim 12, wherein a width of the connection electrode is greater than a width of a second auxiliary electrode; and
- the connection electrode, first auxiliary electrode, and second auxiliary electrode which are stacked form an I-shape.

14. The display substrate according to claim 10, wherein the light emitting structure layer further comprises a pixel definition layer, the pixel definition layer is provided with a first pixel opening and a second pixel opening, the first pixel opening exposes part of a surface of a third anode layer in the anode, and the second pixel opening exposes all of a surface of a second auxiliary electrode in the auxiliary electrode.

15. The display substrate according to claim 10, wherein in a plane parallel to the display substrate, the display substrate comprises multiple sub-pixels, the multiple sub-pixels are sequentially disposed respectively along the first direction and the second direction; in the second direction, auxiliary electrode via holes are located between anode via holes of adjacent sub-pixels.

16. The display substrate according to claim 15, wherein in the second direction, at least two sub-pixels are disposed between adjacent auxiliary electrode via holes.

17. The display substrate according to claim 15, wherein a length of the auxiliary electrode via hole in the second direction is greater than a length of the auxiliary electrode via hole in the first direction; and
- the number of queues of the auxiliary electrode via holes arranged along the second direction is greater than the number of queues of the auxiliary electrode via holes arranged along the first direction.

18. A display device, comprising a display substrate, wherein the display substrate comprises a drive circuit layer disposed on a base substrate and a light emitting structure layer disposed on a side of the drive circuit layer away from the base substrate, wherein the light emitting structure layer comprises an anode, an organic light emitting layer, a cathode, and an auxiliary electrode, the organic light emitting layer is respectively connected to the anode and the cathode, and the cathode is connected to the auxiliary electrode; in a plane perpendicular to the display substrate, the auxiliary electrode comprises a first auxiliary electrode and a second auxiliary electrode disposed on a side of the first auxiliary electrode away from the base substrate; in a plane parallel to the display substrate, an edge of the auxiliary electrode is provided with a structure depressed towards a center of the auxiliary electrode a shape of the first auxiliary electrode and the second auxiliary electrode comprises a polygon provided with a groove; two edges of the first auxiliary electrode and the second auxiliary electrode extending along a first direction are each provided with a first groove depressed towards an inside of the auxiliary electrode along a second direction, and the first direction and the second direction intersect with each other; wherein that the cathode is connected to the auxiliary electrode comprises: the cathode covers a side surface of the second auxiliary electrode and a surface of a side, adjacent to the base substrate, of a portion of the second auxiliary electrode which protrudes from the first auxiliary electrode.

19. A method for manufacturing a display substrate, comprising:
forming a drive circuit layer on a base substrate;
forming a light emitting structure layer on the drive circuit layer, wherein the light emitting structure layer comprises an anode, an organic light emitting layer, a cathode, and an auxiliary electrode, the organic light emitting layer is respectively connected to the anode and the cathode, and the cathode is connected to the auxiliary electrode; in a plane perpendicular to the display substrate, the auxiliary electrode comprises a first auxiliary electrode and a second auxiliary electrode disposed on a side of the first auxiliary electrode away from the base substrate; in a plane parallel to the display substrate, a shape of the first auxiliary electrode and the second auxiliary electrode comprises a polygon provided with a groove; two edges of the first auxiliary electrode and the second auxiliary electrode extending along a first direction are each provided with a first groove depressed towards an inside of the auxiliary electrode along a second direction, and the first direction and the second direction intersect with each other; wherein that the cathode is connected to the auxiliary electrode comprises: the cathode covers a side surface of the second auxiliary electrode and a surface of a side, adjacent to the base substrate, of a portion of the second auxiliary electrode which protrudes from the first auxiliary electrode.

20. The display substrate according to claim 1, further comprising: two edges of the first auxiliary electrode and the second auxiliary electrode extending along the second direction are each provided with a second groove depressed towards an inside of the auxiliary electrode along the first direction.

* * * * *